(12) United States Patent
Hebert

(10) Patent No.: US 9,455,248 B2
(45) Date of Patent: Sep. 27, 2016

(54) SEMICONDUCTOR DEVICE WITH SCHOTTKY DIODE AND MANUFACTURING METHOD THEREOF

(71) Applicant: MagnaChip Semiconductor, Ltd., Cheongju-si (KR)

(72) Inventor: Francois Hebert, Cheongju-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 67 days.

(21) Appl. No.: 14/011,071

(22) Filed: Aug. 27, 2013

(65) Prior Publication Data

US 2014/0346594 A1    Nov. 27, 2014

(30) Foreign Application Priority Data

May 23, 2013    (KR) .......................... 10-2013-0058445

(51) Int. Cl.

| | |
|---|---|
| H01L 29/66 | (2006.01) |
| H01L 27/06 | (2006.01) |
| H01L 29/772 | (2006.01) |
| H01L 27/07 | (2006.01) |
| H01L 29/872 | (2006.01) |
| H01L 29/417 | (2006.01) |
| H01L 29/423 | (2006.01) |
| H01L 29/78 | (2006.01) |
| H01L 29/06 | (2006.01) |
| H01L 29/08 | (2006.01) |

(52) U.S. Cl.
CPC ....... *H01L 27/0629* (2013.01); *H01L 27/0727* (2013.01); *H01L 29/0623* (2013.01); *H01L 29/0847* (2013.01); *H01L 29/41758* (2013.01); *H01L 29/4236* (2013.01); *H01L 29/772* (2013.01); *H01L 29/7827* (2013.01); *H01L 29/872* (2013.01)

(58) Field of Classification Search
CPC    H01L 27/0727; H01L 29/772; H01L 29/872
USPC .......... 257/334, E27.033, E29.262, E29.338
See application file for complete search history.

(56) References Cited

U.S. PATENT DOCUMENTS

| | | | |
|---|---|---|---|
| 4,521,795 A | 6/1985 | Coe et al. | |
| 4,823,172 A | 4/1989 | Mihara | |
| 6,998,678 B2 | 2/2006 | Werner et al. | |
| 7,285,822 B2 | 10/2007 | Bhalla et al. | |
| 7,453,119 B2 | 11/2008 | Bhalla et al. | |
| 8,704,295 B1 * | 4/2014 | Darwish et al. .............. | 257/330 |
| 2011/0121387 A1 | 5/2011 | Hebert et al. | |
| 2011/0133271 A1 * | 6/2011 | Chuang ........................ | 257/334 |
| 2013/0313638 A1 * | 11/2013 | Yoshimochi .................. | 257/334 |

* cited by examiner

*Primary Examiner* — Robert Huber

(57) ABSTRACT

A semiconductor device with an embedded schottky diode and a manufacturing method thereof are provided. A semiconductor device having a schottky diode include: an epilayer of a first conductivity type, a body layer of a second conductivity type, and a source layer of the first conductivity type arranged in that order; a gate trench that extends from the source layer to a part of the epilayer; a body trench formed a predetermined distance from the gate trench and extends from the source layer to a part of the epilayer; and a guard ring of the second conductivity type that contacts an outer wall of the body trench and formed in the epilayer.

30 Claims, 22 Drawing Sheets

SEMICONDUCTOR DEVICE WITH SCHOTTKY DIODE AND MANUFACTURING METHOD THEREOF

CROSS-REFERENCE TO RELATED APPLICATION

This application claims the benefit under 35 U.S.C. §119 (a) to Korean Patent Application No. 10-2013-0058445 filed on May 23, 2013, in the Korean Intellectual Property Office, the entire disclosure of which is incorporated herein by reference for all purposes.

BACKGROUND

1. Field

The following description relates to a semiconductor device with an embedded schottky diode and a manufacturing method thereof, and to, for example, a semiconductor device with an embedded schottky diode integrated within the semiconductor device to improve switching efficiency, and a manufacturing method for fabricating such a semiconductor device.

2. Description of Related Art

Schottky diodes are generally used as a switching device or a rectifier device in a semiconductor device. Schottky diodes include a metal-semiconductor junction that is formed between a semiconductor and a metal. Compared to general PN junction diodes having a semiconductor-semiconductor junction, schottky diodes provide not only an improved fast switching characteristic, but also a lower turn-on voltage. This is because, unlike PN junction diodes, schottky diodes do not have a minority carrier injection (MIC) when the forward voltage is applied thereto. Because currents flow through schottky diodes via majority carriers instead of minority carriers, schottky diodes provide advantages of no accumulative effect and very short reverse recovery time.

Schottky diodes exhibit excellent performance as a switching device and exhibit a lower turn-on voltage than conventional PN junction diodes. Accordingly, techniques have been developed to reduce the ringing generated from the switching device when schottky diodes are used, to improve switching efficiency and also to reduce conduction loss of the body diode, by providing a structure that connects the schottky diode to a conventional PN junction diode in parallel.

For example, a separate schottky diode from the body diode is connected in parallel to the body diode or a separate schottky diode is added into a semiconductor diode. However, these conventional examples have drawbacks. For example, the operational efficiency is not greatly improved due to parasitic inductance generated from separate electrical contacts, or the unit cost of the device increases due to need for additional space for the diode.

SUMMARY

In one general aspect, there is provided a semiconductor device having a schottky diode, the semiconductor device including: an epilayer of a first conductivity type, a body layer of a second conductivity type, and a source layer of the first conductivity type arranged in that order; a gate trench that extends from the source layer to a part of the epilayer; a body trench formed a predetermined distance from the gate trench and extends from the source layer to a part of the epilayer; and a guard ring of the second conductivity type that contacts an outer wall of the body trench and formed in the epilayer.

The gate trench may include: a gate polysilicon formed within the gate trench; and a gate insulating layer that surrounds the gate polysilicon.

The guard ring may protrude into both the epilayer and the body layer.

The guard ring may have a doping ion implant dose equal to that of the body layer.

The general aspect of the semiconductor device may further include a second conductivity type body diffusion region formed in the body layer and contacts an outer wall of the body trench.

The body diffusion region may contact a lower surface of the source layer.

In another general aspect, there is provided a semiconductor device with a schottky diode, the semiconductor device including: an epilayer of a first conductivity type, a body layer of a second conductivity type, a source layer of the first conductivity type arranged in that order; a gate trench that extends from the source layer to a part of the epilayer; a first body trench and a second body trench formed a predetermined distance from the gate trench and extend into the semiconductor device from the source layer, the first body trench and the second body trench having different depths; and a first guard ring of the second conductivity type that contacts an outer wall of the first body trench and formed in the epilayer.

The gate trench may include: a gate polysilicon formed within the gate trench; and a gate insulating layer that surrounds the gate polysilicon.

The first body trench may extend from the source layer to a part of the epilayer in a direction perpendicular to an upper surface of the source layer, and the second body trench may extend from the source layer to a part of the body layer in a direction perpendicular to the upper surface of the source layer.

The first guard ring may protrude into both the epilayer and the body layer.

The general aspect of the semiconductor device may further include a second guard ring of the second conductivity type that contacts an outer wall of the second body trench and formed in the body layer.

The first and second guard rings may have doping concentrations that are equal to a doping concentration of the body layer.

The general aspect of the semiconductor device may further include a body diffusion region of the second conductivity type formed in the body layer to contact an outer wall of the first and second body trenches.

The body diffusion region may contact a lower surface of the source layer.

The general aspect of the semiconductor device may further include a second guard ring of the second conductivity type formed in the body layer and contacts an outer wall of the second body trench.

The first and second guard rings may have doping concentrations that are equal to a doping concentration of the body layer.

The body diffusion region and the second guard ring may be merged with each other.

In another general aspect, there is provided a semiconductor device with a schottky diode, the semiconductor device including: an epilayer of a first conductivity type, a body layer of a second conductivity type, a source layer of a first conductivity type arranged in that order; a gate trench that extends from the source layer to a part of the epilayer; a first body trench and a second body trench formed a predetermined distance from the gate trench and extend from the source layer to a part of the body layer; and a first guard ring of the second conductivity type formed in the body layer and contacts an outer wall of the first body trench.

The gate trench may include: a gate polysilicon formed within the gate trench; and a gate insulating layer that surrounds the gate polysilicon.

The first and second body trenches may extend to a same depth.

The general aspect of the semiconductor device may further include a second guard ring of the second conductivity type formed in the body layer and contacts an outer wall of the second body trench.

The first and second guard rings may have doping concentrations that are equal to a doing concentration of the body layer.

The first and second body trenches may have different depths.

The general aspect of the semiconductor device may further include a second guard ring of the second conductivity type formed in the body layer and contacts a lower wall of the second body trench.

The first conductivity type may be an N type and the second conductivity type is a P type.

In another general aspect, there is provided a method for fabricating a schottky diode in a semiconductor device comprising an epilayer of a first conductivity type, a body layer of a second conductivity type and a source layer of the first conductivity type arranged in that order, and a gate trench extending from the source layer to a part of the epilayer with a first depth, the method involving: (A) etching, at a predetermined distance from the gate trench, through the source layer to a second depth; (B) ion-implanting ions of a second conductivity type into an interior of an etched portion; and (C) forming a body trench by etching through a region of the second conductivity type to a third depth.

The general aspect of the method may further include: forming an etching mask on the semiconductor device prior to the etching to the second depth (A), wherein the etching to the second depth (A) involves etching an area exposed through the etching mask.

The second depth may range between 0.3 μm and 0.9 μm from an upper surface of the source layer.

The ion-implanting (B) may involve injecting ions at an ion implant dose between 1E12 atoms/cm^2 and 4E13 atoms/cm^2.

The general aspect of the method may further include: performing an RTA process on the semiconductor device after the ion-implanting (B).

The third depth may range between 0.1 μm and 0.3 μm.

The forming of the body trench by etching to the third depth (C) may involve a blanket etching process.

The etching to the second depth (A) may involve: (A-1) etching from an upper surface of the source layer to a fourth depth in a direction perpendicular to the upper surface of the source layer; (A-2) ion-implanting ions of the second conductivity type into an interior of an etched portion of the fourth depth; and (A-3) etching through a region of the second conductivity type to a part of the epilayer to a fifth depth.

The fourth depth may range between 0.2 μm and 0.3 μm from the upper surface of the source layer.

The ion-implanting of ions of the second conductivity type may involve injecting ions at an ion implant dose between $5 \times 10^{14}$ atoms/cm$^2$ and $1 \times 10^{16}$ atoms/cm$^2$.

The fifth depth may range between 0.1 μm and 0.3 μm.

The etching to the fourth depth (A-1) and the etching to the fifth depth (A-3) both may involve a blanket etching process.

In another general aspect, there is provided a method for fabricating a schottky diode in a semiconductor device comprising an epilayer of a first conductivity type, a body layer of a second conductivity type and a source layer of a first conductivity type arranged in that order, and a gate trench extending from the source layer to a part of the epilayer, the method involving: (A) etching a first area and a second area at a predetermined distance from the gate trench, through the source layer to a second depth; (B) forming a schottky mask with respect to an etched portion of the second area; (C) further etching the first area where the schottky mask is not formed to a third depth; (D) ion-implanting ions of the second conductivity type into an interior of a further etched portion of the first area (C); and (E) forming a body trench by etching the first area and second area to a fourth depth.

The general aspect of the method may further include: forming an etching mask on the semiconductor device prior to the etching to the second depth (A), wherein the etching to the second depth involves etching an area exposed through the etching mask.

The second depth may range between 0.1 μm and 0.3 μm from an upper surface of the source layer.

The third depth may range between 0.3 μm and 0.9 μm from an upper surface of the source layer.

The ion-implanting (D) may involve injecting ions at an ion implant dose between $1 \times 10^{12}$ atoms/cm$^2$ and $4 \times 10^{13}$ atoms/cm$^2$.

The general aspect of the method may further include: performing an RTA process on the semiconductor device after the ion-implanting (D).

The fourth depth may range between 0.1 μm and 0.2 μm.

The forming of the body trench by etching to the third depth (E) may involve a blanket etching process.

The general aspect of the method may further include: (D2) ion-implanting ions of the second conductivity type of impurity into the second area that is etched, prior to the forming of the body trench (E).

The ion-implanting of the first area (D) and the ion-implanting of the second area (D2) may involve injecting ions at an ion implant dose between $1 \times 10^{12}$ atoms/cm$^2$ and $4 \times 10^{13}$ atoms/cm$^2$.

The general aspect of the method may further include: (A2) ion-implanting ions of the second conductivity type into an interior of the first area and the second area etched to the second depth (A), prior to the forming of the schottky mask with respect to the second area (B).

The general aspect of the method may further include: (D2) ion-implanting ions of the second conductivity type of impurity into the etched second area prior to the forming of the body trench (E).

The ion-implanting of the first area and the second area (A2) and the ion-implanting of the second area (D2) may involve injecting ions at an ion implant dose between $1 \times 10^{12}$ atoms/cm$^2$ and $4 \times 10^{13}$ atoms/cm$^2$.

In another general aspect, there is provided a method for fabricating a schottky diode in a semiconductor device comprising an epilayer of a first conductivity type, a body layer of a second conductivity type and a source layer of a first conductivity type arranged in that order, and a gate trench extending from the source layer to a part of the epilayer, the method involving: (A) etching a first area and a second area at a predetermined distance from the gate trench, through the source layer to a second depth; (B) ion-implanting ions of the second conductivity type into an interior of an etched portion of the second depth; (C) forming a schottky mask with respect to an etched portion of the second area; and (D) etching the first area where the schottky mask is not formed, to a third depth through a region ion-implanted with ions of the second conductivity type.

The second depth may range between 0.3 μm and 0.4 μm from an upper surface of the source layer.

The ion-implanting (B) may involve implanting ions at an ion implant dose between $1 \times 10^{13}$ atoms/cm$^2$ and $1 \times 10^{14}$ atoms/cm$^2$.

The third depth may range between 0.1 μm and 0.2 μm dose between yer. ns of h through thr.

The first conductivity type may be an N type. The second conductivity type may be a P type.

Other features and aspects may be apparent from the following detailed description, the drawings, and the claims.

Figure 1:
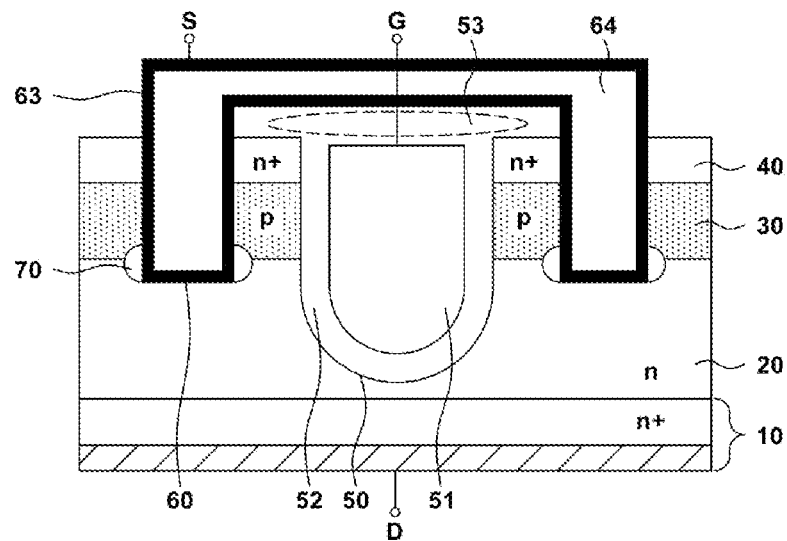
FIGS. 1 and 2 illustrate an example of a semiconductor device with embedded schottky diode.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

While the expressions such as "first" or "second" can be used to refer to various elements, the elements are not limited by the expressions. The expressions are used only for the purpose of distinguishing one element from the other.

The expressions are used herein only for the purpose of explaining specific examples and not to limit the present disclosure. An expression in singular form encompasses plural meaning, unless otherwise specified. Throughout the description, the expression "comprise" or "have" is used only to designate the existence of characteristic, number, step, operation, element, component or a combination thereof which are described herein, but not to preclude possibility of existence of one or more of the other characteristics, numbers, steps, operations, elements, components or combinations of these or addition.

The spatially-relative expressions such as "below", "beneath", "lower", "above", "upper", etc. may be used to conveniently describe relationships of one device or elements with other devices or among elements. The spatially-relative expressions should be understood as encompassing the direction illustrated in the drawings, added with other directions of the device in use or operation. For example, a device explained as being located "below" or "beneath" another device may also be placed "above" or "upper" said another device. That is, since the expression "below" or "beneath" is used to provide examples only, the expression may encompass both the upward and downward directions. Further, the device may be oriented to other directions and accordingly, the interpretation of the spatially-relative expressions is based on the orientation.

Further, the expression such as "first conductivity type" and "second conductivity type" as used herein may refer to the conductivity types such as n or p types which are opposed to each other, and an example explained and exemplified herein encompasses complementary examples thereof. Hereinbelow, an example is explained, in which the first conductivity type of an N type and the second conductivity type is a P type.

Accordingly, the embodiments of the present invention will be explained below in detail with reference to the drawings attached hereto.

Figure 2:
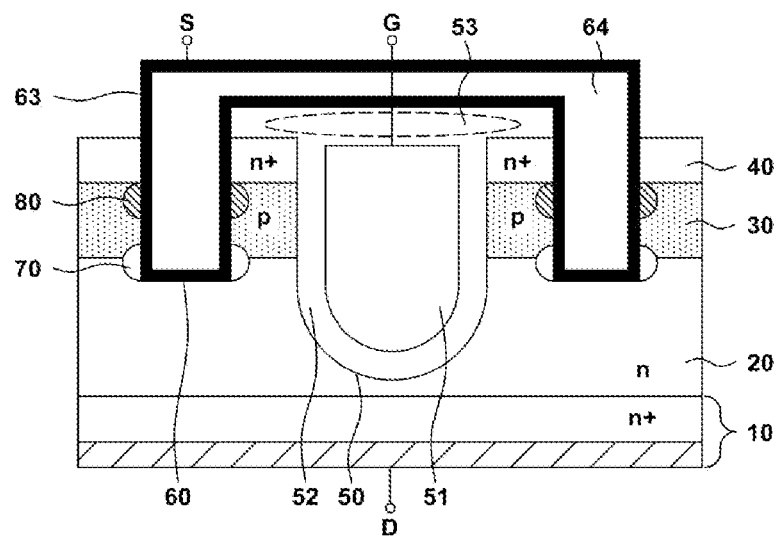

FIGS. 1 and 2 illustrate an example of a semiconductor device with embedded schottky diode.

Referring to FIG. 1, a semiconductor device with an embedded schottky diode according to this example includes an N type epilayer 20; a P type body layer 30 stacked on an upper portion of the N type epilayer 20; an N+ type source layer 40 stacked on an upper portion of the P type body layer 30; a gate trench 50 extended from the N+ type source layer 40 to a part of the N type epilayer 20; a body trench 60 formed at a predetermined distance to the left and right of the gate trench 50 and extended from the source layer 40 to a part of the epilayer 20; and a P type guard ring 70 formed in the epilayer 20 in abutment to the outer wall of the body trench 60.

The semiconductor device according to this example includes an N+ type substrate 10 of high ion implant dose and an N type epitaxial layer (hereinbelow, 'epilayer') of low concentration, which is formed with a predetermined thickness on an upper portion of the N+ type substrate 10. Further, a P type body layer 30 is stacked on an upper portion of the epilayer 20, and the N+ type source layer 40 is stacked on an upper portion of the body layer 30 in turn.

Further, the semiconductor device includes a gate trench 50 and a body trench 60 that extend into to the semiconductor substrate 10 by a predetermined depth, perpendicularly from the surface of the N+ type source layer 40 to the inside of the N type epilayer 20, as illustrated in FIG. 1. The gate trench 50 and the body trench 60 extend into the N type epilayer 20 by a first depth and a second depth from the source layer 40, respectively, and are at a predetermined distance from each other. The first and second depths may be identical or alternatively, the first depth may be smaller than the second depth. Further, the body trench 60 is placed to the left and right of the gate trench 50. Accordingly, the width of the areas (i.e., mesa) between the gate trench 50 and the body trench 60 are equal or almost equal.

According to an example of the semiconductor device, the gate trench 50 includes a gate polysilicon 51 and a gate insulating layer 52. The gate polysilicon 51 is electrically connected to a separate gate metal (not illustrated). Further, the gate polysilicon 51 may be doped with, for example, N type or P type impurity.

Further, an interlayer insulating layer 53 is formed on the gate trench 50. Accordingly, the gate polysilicon 51 and the source metal 64, which is formed on the body trench 60, are not shorted with each other.

According to another example, the body trench 60 may be formed into a rectangular trench structure as illustrated in FIG. 1. Of course, the semiconductor device according to the present disclosure is not limited to the above examples. For instance, the body trench 60 may have a curved lower end.

According to an example of the semiconductor device, a P type guard ring 70 is formed in the epilayer 20 in contact with an outer wall of the body trench 60. For example, the P type guard ring 70 may be formed, inclusive of a partial area of the epilayer and the body layer. The P type guard ring 70 is formed at an area where an edge of the body trench 60 contacts the epilayer 20, to play a role of preventing the breakdown effect that can occur at the edge area. At this time, the guard ring 70 improves the breakdown voltage of the schottky diode by lessening the curvature of the depletion layer and the magnitude of electric field formed at the edge area. Accordingly, a semiconductor device with an embedded schottky diode may be formed to implement fast speed switching characteristic, and also to control large currents.

In one example of the semiconductor device, the P type guard ring 70 can be doped at the same ion implant dose as the P type body layer 30. For example, the P type guard ring 70 may be doped with P type impurity ions at the same ion implant dose as the P type body layer 30 to improve the breakdown voltage of the schottky diode. Further, it is possible to control the P type guard ring 70 separately from the diffusion of the body diffusion region 80 to be explained below, by having the doping concentration of the P type guard ring 70 different from the doping concentration of the body diffusion region 80.

Further, the semiconductor device according to one example includes a bather metal 63 along an inner wall of the body trench 60. The barrier metal 63 is formed in the low-concentration N type epilayer 20, P type body layer 30 and high-concentration N+ type source layer 40. The barrier metal 63 and the N type epilayer 20 substantially construct a schottky contact therebetween and also form silicide.

As explained above, in an example of the semiconductor device, because the barrier metal 63 is substantially schottky-contacted to the N type epilayer 20, the schottky diode can naturally form on the contact area. The barrier metal 63 plays a role of the schottky metal layer. Thus, a metal-semiconductor junction forms between the barrier metal 63 and the N type epilayer 20, for example. Of course, the P type body layer 30 and the N type epilayer 20 construct a pn junction diode. Accordingly, the semiconductor device according to this example includes therein not only the pn junction diode, but also a schottky diode. The barrier metal 63 can be any one selected from Co, Ta, Mo, Ti, Pt, W, Ni, TiN, but the material for the barrier metal 63 is not limited to these examples.

Further, the source metal 64 can be formed on the barrier metal 63, by being deposited within the body trench 60. The source metal can be AlCu alloy (typically 0.5 to 1.5% copper in aluminum), pure Cu composition, W or Al, but the source meal is not limited to these examples.

Referring to FIG. 2, according to another example of the semiconductor device, the semiconductor device can additionally include a high-concentration P+ type body diffusion region 80 that is formed in an area of the P type body layer 30 in contact with the outer wall of the body trench 60. The P type body diffusion region 80 may be formed along a lower surface of the N+ type source layer 40.

The P+ type body diffusion region 80 (also referred to as the P+ Body Contact diffusion) plays a role of increasing the doping concentration of the base of the NPN parasitic bi-polar transistor including N+ source, P type body and N type epilayer to thus prevent the operation of the parasitic bi-polar transistor. Further, the P+ type body diffusion region 80 plays a role of preventing 'punch through' phenomenon, which refers to the merge of the depletion zones of the source and drain. Because the P+ type body diffusion region 80 is formed in the P type body layer 30 area, contacting a lower end of the N+ type source layer, the overall channel size is reinforced. As a result, the punch through phenomenon is prevented.

The remaining elements will not be explained in detail here because their description is substantially identical to that of the elements described above with respect to the semiconductor device illustrated in FIG. 1. Accordingly, the description of these elements can be obtained by referring to the above explanation with respect to FIG. 1.

FIGS. 3 to 6 illustrate additional examples of semiconductor devices having an embedded schottky diode.

Figure 3:
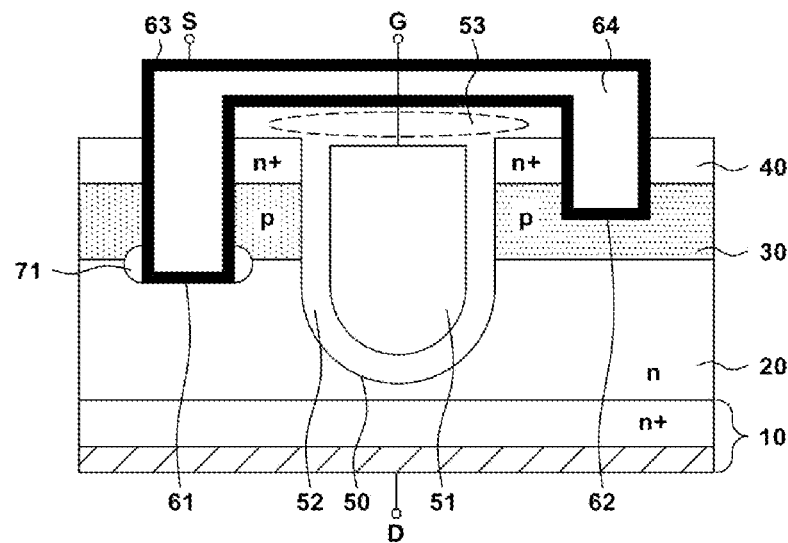
FIGS. 3 to 6 illustrate additional examples of a semiconductor device with embedded schottky diode.

Referring to FIG. 3, a semiconductor device with an embedded schottky diode according to one example of the present disclosure includes: a N type epilayer 20 formed on an upper portion of a high-concentration N+ type substrate 10; a P type body layer 30 stacked on an upper portion of the N type epilayer 20; a high-concentration N+ type source layer 40 stacked on an upper portion of the P type body layer 30; a gate trench 50 extended perpendicularly from the N+ type source layer 40 to a part of the N type epilayer 20 to a first depth; a first and a second body trenches 61, 62 extended perpendicularly from the N+ type source layer 40 to different depths from each other; and a first guard ring 71 formed in the N type epilayer 20, contacting an outer wall of the first body trench 61.

Unlike the example illustrated in FIG. 1, the first and second body trenches 61, 62 formed to the left and right of the gate trench 50 have different depths. Referring to FIG. 3, the body trench formed to the left of the gate trench 50 is referred to as the 'first body trench 61', while the body trench formed to the right of the gate trench 50 is referred to as the 'second body trench 62.' However, the present disclosure is not limited to only these examples.

Referring to FIG. 3, the first body trench 61 extends from the N+ type source layer 40 into a part of the N type epilayer 20. The depth of the first body trench 61 (i.e., second depth) may be less than the depth of the gate trench 50. On the contrary, the second body trench 62 extends from the N+ type source layer 40 into a part of the P type body layer 30 and may have a smaller depth than that of the first body trench 61.

Further, a first P type guard ring 71 may be formed at a portion of the epilayer 20 in such a manner as to contact the outer wall of the first body trench 61. The first P type guard ring 71 may include a portion of the N type epilayer 20 and P type body layer 30. In one example, the first P type guard ring 71 may be doped at the same ion implant dose as that of the impurities of the P type body layer 30.

The second body trench 62 extends from a lower surface of the N+ type source layer 40 to a part of the P type body layer 30. Because the second body trench 62 does not directly contact the N type epilayer 20, schottky contact is not formed with the N type epilayer 20. However, the second body trench 62 may operate like a schottky diode, depending on the thickness of the P type body layer 30 on the lower surface of the second body trench 62.

Figure 4:
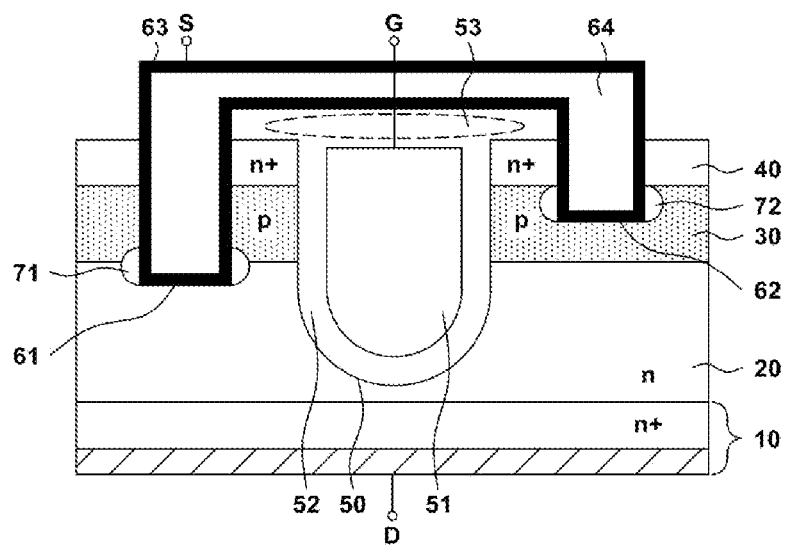

The second body trench 62 may not have a separate P type guard ring on the outer wall as illustrated in FIG. 3, or may have a second P type guard ring 72 on the outer wall as illustrated in FIG. 4. For instance, the second P type guard ring 72 may be doped at the same ion implant dose as the impurities on the P type body layer 30.

Figure 5:
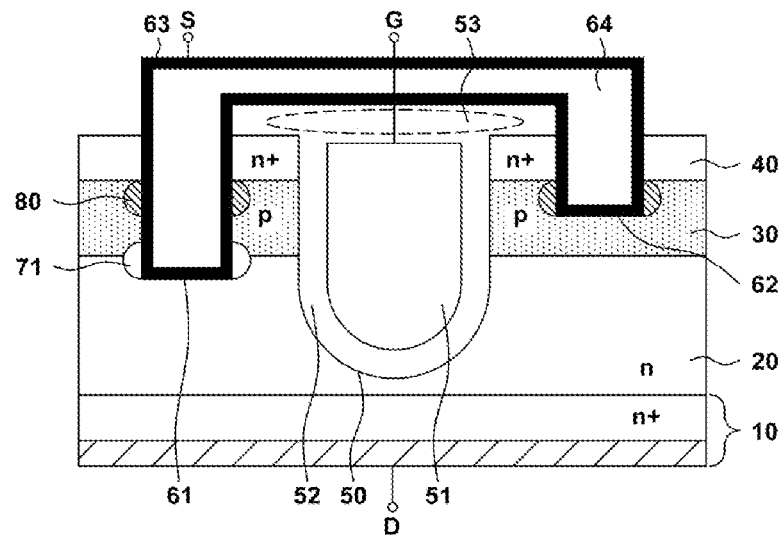

Further, according to another example, the semiconductor device may additionally include a high-concentration P+ type body diffusion region 80 formed within the body layer 30, in contact with the outer walls of the first and second body trenches 61, 62, as illustrated in FIG. 5. The P+ type body diffusion region 80 may, for instance, be formed so as to contact the lower surface of the N+ type source layer 40. The information related to other features of the semiconductor device will be omitted for conciseness. The details of the other features are explained above with reference to the semiconductor device illustrated in FIG. 1.

Figure 6:
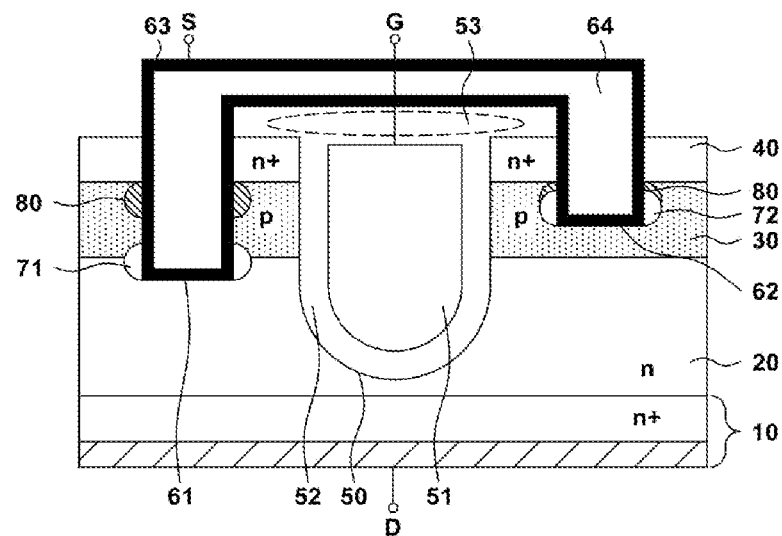

Further, referring to FIG. 6, the semiconductor device according to another example may include a high-concentration P+ type body diffusion region 80 and first and second P type guard rings 71, 72. The P+ type body diffusion region 80 and the second P type guard ring 72, formed in the outer wall of the first body trench 61, may be joined with each other, as illustrated in FIG. 6.

Figure 7:
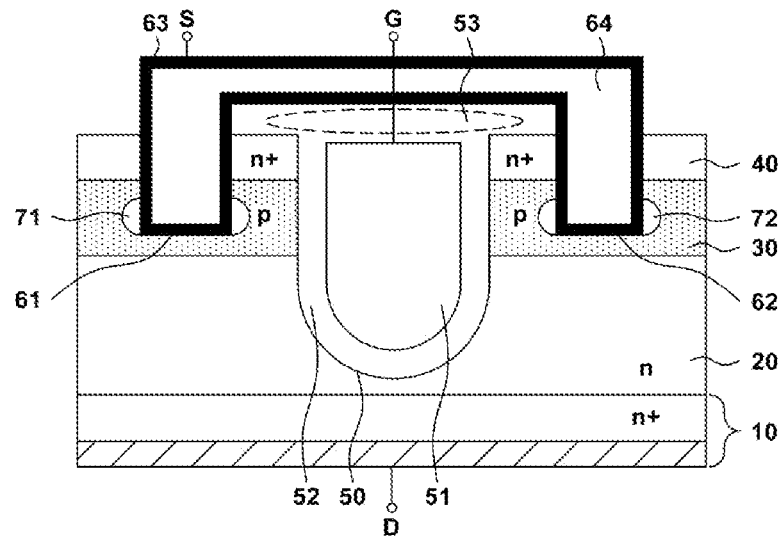
FIGS. 7 and 8 illustrate a semiconductor device with embedded schottky diode according to yet another example.
Figure 8:
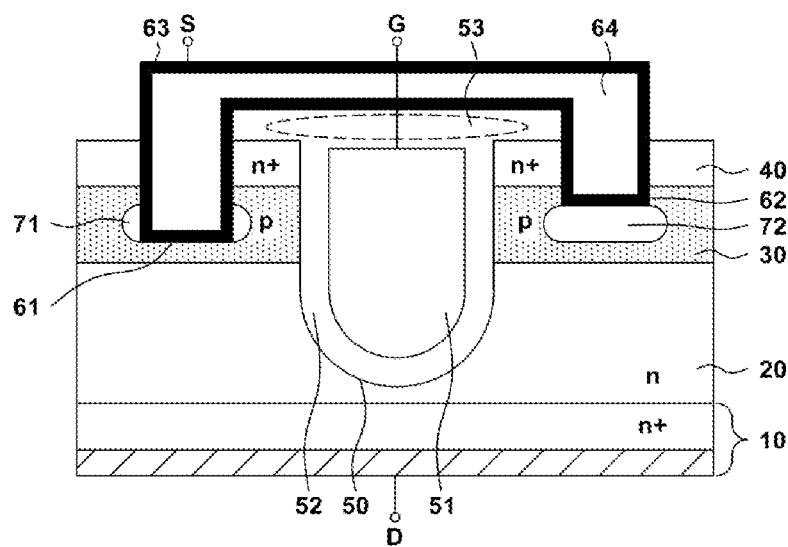

FIGS. 7 and 8 illustrate additional examples of a semiconductor device with an embedded schottky diode.

Referring to FIG. 7, a semiconductor device with an embedded schottky diode according to one example includes: a N type epilayer 20 formed on an upper portion of the high-concentration N+ type substrate 10; a P type body layer 30 stacked on the upper portion of the N type epilayer 20; a high-concentration N+ type source layer 40 stacked on the upper portion of the P type body layer 30; a gate trench 50 extending from the N+ type source layer 40 to a part of the N type source layer 40 to a first depth; a first body trench and a second body trench 61, 62 formed a predetermined distance to the left and right of the gate trench 50 and extending perpendicularly from the N+ type source layer 40 to a part of the P type body layer 30; and a first P type guard ring 71 contacting an outer wall of the first body trench 61 and formed in the P type body layer 30.

Unlike the examples illustrated in FIGS. 1 to 6, according to the examples illustrated in FIGS. 7 and 8, the first and second body trenches 61, 62 extend from the N+ type source layer 40 to only the P type body layer 30. The first body trench 61 may be so formed that its lower surface is at a near distance to the upper surface of the N type epilayer 20, in which case the first body trench 61 can operate like a schottky diode.

Referring to FIG. 7, in one example of the semiconductor device, the first and second body trenches 61, 62 may be formed to have the same depth, and the first and second P type guard rings 71, 72 may be formed in the P type body layer 30 to contact the outer wall of the first and second body trenches 61, 62. In this example, the first and second P type guard rings 71, 72 may be doped at the same concentration as the impurities of the P type body layer 30.

Alternatively, referring to FIG. 8, according to another example of a semiconductor device, the first and second body trenches 61, 62 may be formed to have different depths. For example, the second P type guard ring 72 may be formed in a lower surface of the second body trench 62 that is formed to have a smaller depth than the first body trench 61.

FIG. 9A-9D illustrate an example of a manufacturing method of a semiconductor device with an embedded schottky diode.

Figure 9A:
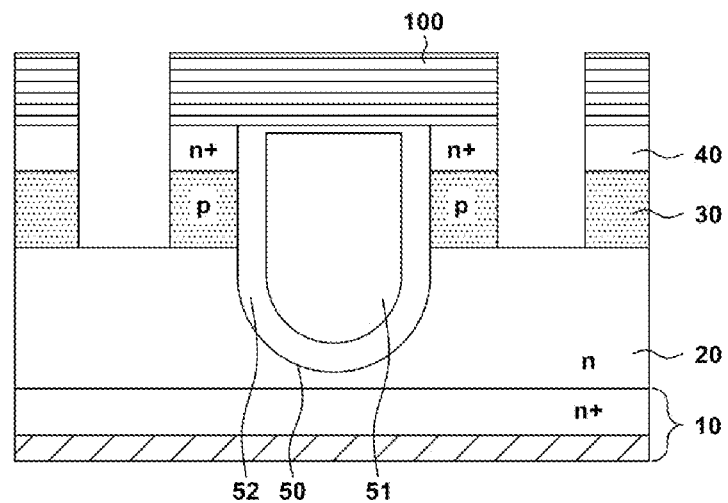
FIG. 9A to 9D illustrate an example of a method for manufacturing a semiconductor device with embedded schottky diode.

First, referring to FIG. 9A, on the high-concentration N+ type substrate 10, the N type epilayer 20, the P type body layer 30 and the high-concentration N+ type source layer 40 are stacked in turn. To form a trench structure that is positioned a predetermined distance away from the gate trench 50 and that extends perpendicularly to a part of the N type epilayer 20, the semiconductor device with the gate trench 50 that extends perpendicularly from the N+ type source layer 40 to the part of the N type epilayer 20 to the first depth is etched to a second depth.

Referring to FIG. 9A, the N type epilayer 20, the P type body layer 30 and the high-concentration N+ type source layer 40 are stacked on the high-concentration N+ type substrate 10 in turn. An oxide layer 100 is deposited on the semiconductor device with the gate trench 50 extending from the N+ type source layer 40 to a part of the N type epilayer 20. An etching mask is formed on the oxide layer 100 so that there is an opening at the areas to be etched. Thus, the exposed areas of the etching mask may be etched without etching other areas. Separate from the etching on the oxide layer 100, in one example, the semiconductor device may be etched to the second depth.

In one example of the method of forming a semiconductor device, the second depth may range between 0.3 µm and 0.9 µm. However, the second depth is an example of a depth beginning from the upper surface of the source layer and extending through the body layer 30 of the semiconductor device. In other words, any other depth may be applied if this can ensure that the etched portion is extended through the body layer 30 of the semiconductor device.

Figure 9B:
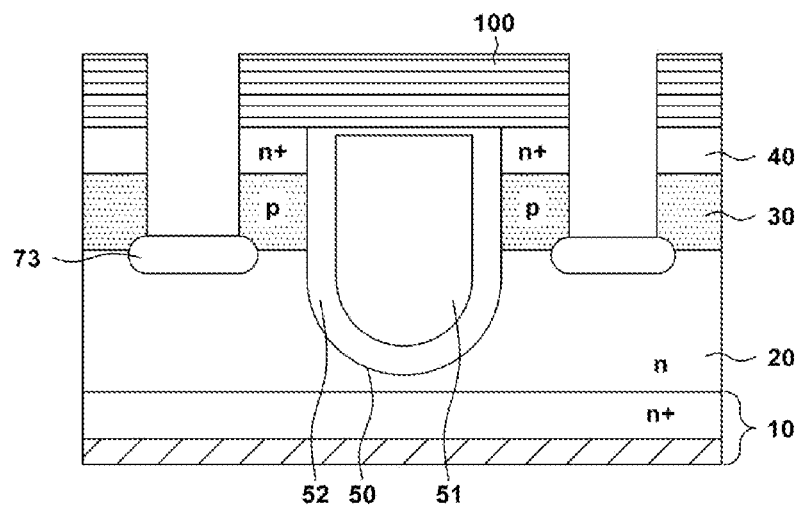
Figure 9C:
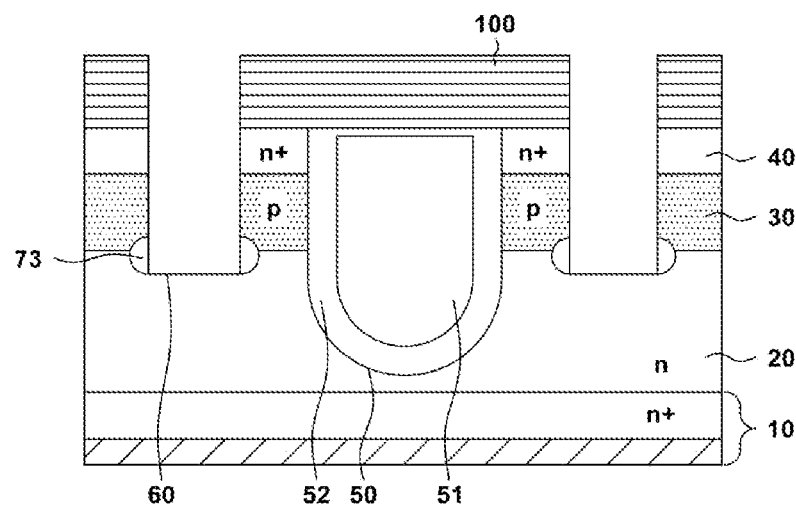

After that, referring to FIG. 9B, P type impurity is ion-implanted into the etched body diffusion region, to thus form P type impurity region 73.

In one example of the method, the P type impurity region 73 may be formed using ions derived from $BF_2$ or $B_{11}$. The tilting angle of the P type impurity may be 0 degree. For instance, the ion implant dose of the P type impurity may range between $1 \times 10^{12}$ atoms/cm$^2$ and $4 \times 10^{13}$ atoms/cm$^2$. Further, a Rapid Thermal Anneal (RTA) process is performed after the P type impurity is implanted, to remove defects resulting from the ion implantation and also to activate the dopant while minimizing diffusion. After that, referring to FIG. 9C, the ion-implanted P type impurity region 73 is etched to a third depth, so that the body trench 60 is formed. The third depth may be determined appropriately within a range that can ensure that the P type impurity 73 region is removed. For example, the third depth may be between 0.1 µm and 0.3 µm.

A blanket etching process, which does not require a separate mask, may be applied for the etching to the third depth. Because general etching process has selectivity, if the oxide layer 100 and the semiconductor device have different properties to each other, it is possible to etch the semiconductor device without the oxide layer 100 deposited thereon, without requiring a separate mask.

Figure 9D:
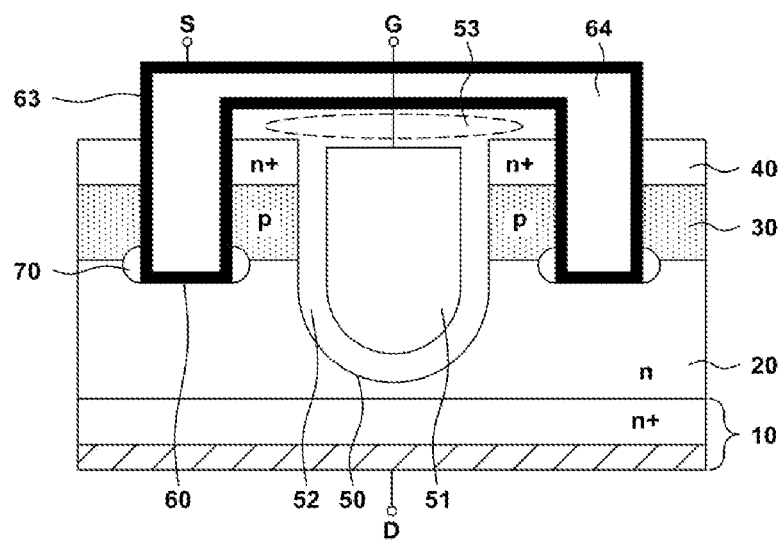

After that, referring to FIG. 9D, the barrier metal 63 may be formed within the body trench 60, and the source metal 64 may be formed on the barrier metal 63. According to one example, the barrier metal 63 may be Co, Ta, Mo, Ti, Pt, W, Ni, or TiN, and the source metal 64 may be Ti, TiN, or W.

FIGS. 10A-10E illustrate an example of a method for fabricating a semiconductor device with an embedded schottky diode.

Figure 10A:
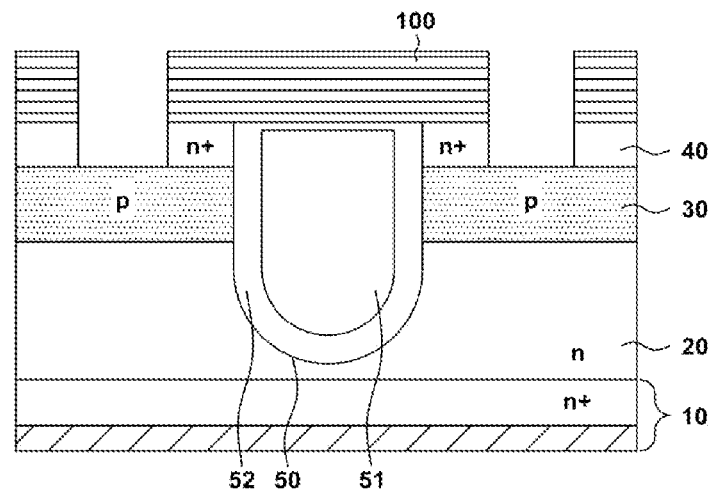
FIG. 10A to 10E illustrate another example of a method for manufacturing a semiconductor device with embedded schottky diode.

Referring to FIG. 10A, the N type epilayer 20, the P type body layer 30 and the high-concentration N+ type source layer 40 are stacked on the high-concentration N+ type substrate 10 in turn. On the semiconductor device in which the gate trench 50 perpendicularly extends from the N+ type source layer 40 to a part of the N type epilayer 20 to the first depth, etching is performed to a fourth depth to form a trench structure. The trench structure is positioned a predetermined distance away from the gate trench 50, and extends from the N+ type source layer 40 in a direction perpendicular to the surfaces of the N+ type source layer 40. For example, an oxide layer 100 may be deposited on the semiconductor device, and an etching mask having an opening for areas to be etched is formed on the oxide layer 100 in order to etch the exposed areas of the etching mask. Separately from the etching on the oxide layer 100, the semiconductor device may be etched to the fourth depth, according to an example of the method for fabricating a semiconductor device.

In one example of the method, the fourth depth may range between 0.2 μm and 0.3 μm. However, the fourth depth is an example of a depth beginning from the surface of the N+ type source layer and extending through the N+ type source layer 40 of the semiconductor device. In other words, any other depth may be applied if this can ensure that the etched portion is extended through the N+ type source layer 40 of the semiconductor device.

Figure 10B:
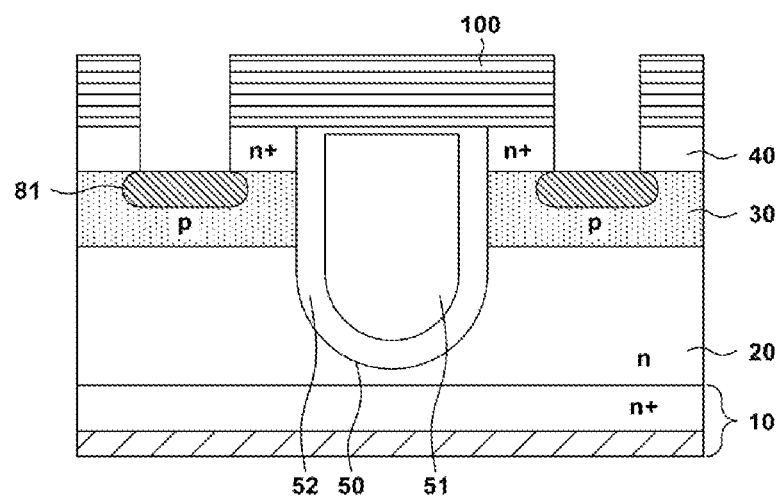
Figure 10C:
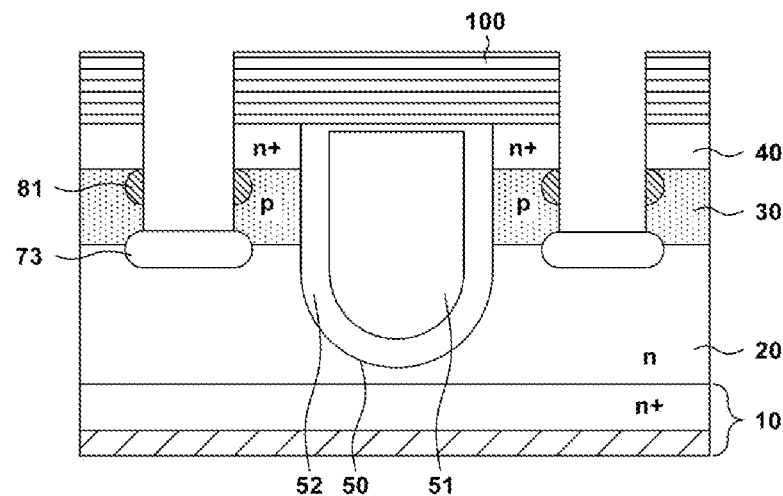
Figure 10D:
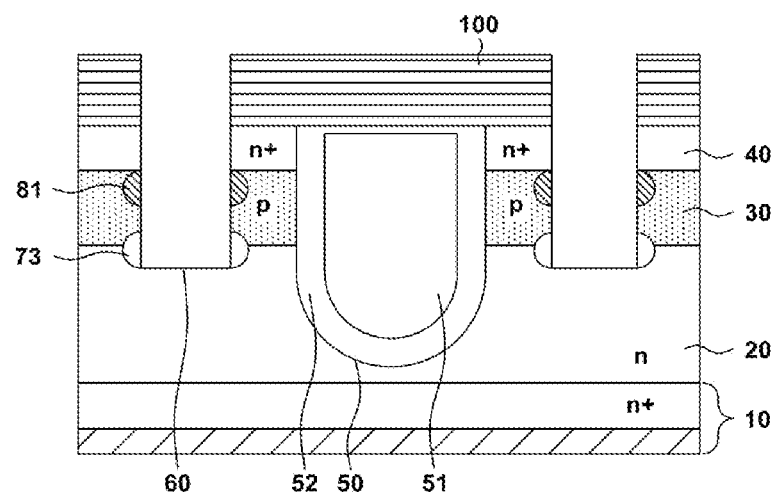

After that, referring to FIG. 10B, the high-concentration P+ type impurity is ion-implanted into the etched portion of the etching step, to thus form P+ type impurity region 81.

In one example of the method, the high-concentration P+ type impurity may be obtained with $BF_2$, etc. For example, the ion implant dose of the high-concentration P+ type impurity may range between $5\times10^{14}$ atoms/cm$^2$ and $1\times10^{16}$ atoms/cm$^2$. Further, an RTA process is performed at 900~1050° C. for 10 to 30 sec., in nitrogen ambient, after the high-concentration P+ type impurity is implanted, to remove defects resulting from the ion implantation and also to activate the dopant while minimizing diffusion. After that, referring to FIG. 10C, the ion-implanted high-concentration P+ type impurity region 81 is perpendicularly etched to a fifth depth. The fifth depth may range between 0.1 μm and 0.5 μm.

A blanket etching process that does not require a separate mask may be performed to carry out the etching to the fifth depth.

Because general etching process has selectivity, if the oxide layer 100 and the semiconductor device have different properties to each other, it is possible to etch the semiconductor device without the oxide layer 100 deposited thereon, without requiring a separate mask.

Further, P type impurity is ion-implanted into the etched area, to thus form P type impurity region 73. In one example, the P type impurity ions may be $BF_2$ ions or $B_{11}$ ions. That is, the P type impurity region 73 may be formed using $BF_2$ or $B_{11}$. The tilting angle of the P type impurity may be 0. For example, the ion implant dose of the P type impurity may range between $1\times10^{12}$ atoms/cm$^2$ and $4\times10^{13}$ atoms/cm$^2$. Further, an RTA process is performed after the P type impurity is implanted, to remove defects resulting from the ion implantation and also to activate the dopant while minimizing diffusion. After that, referring to FIG. 10D, the ion-implanted P type impurity region 73 is etched to a third depth, so that the body trench 60 is formed. The third depth may be determined appropriately within a range that can ensure that the P type impurity 73 region is removed. For example, the third depth may be between 0.1 μm and 0.3 μm.

Further, a blanket etching process that does not require a separate use of a mask, may be applied for the etching to the fifth depth. Because the oxide layer 100 and the semiconductor device are formed from materials of different properties to each other, it is possible to etch the semiconductor device region only where the oxide layer 100 is not deposited, by applying a method that etches only the semiconductor device without requiring a separate mask.

Figure 10E:
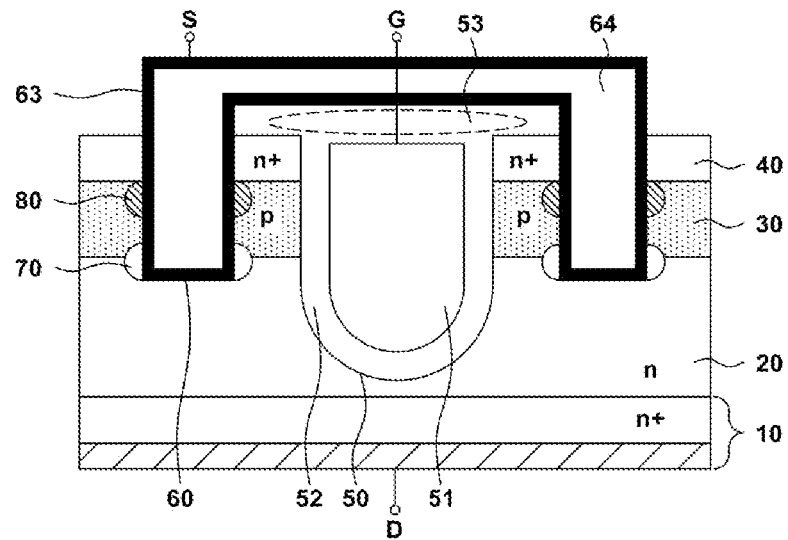

After that, referring to FIG. 10E, the barrier metal 63 may be formed within the body trench 60, and the source metal 64 may be formed on the barrier metal 63. In one example method, the barrier metal 63 may be Co, Mo, Ti, Pt, W, Ni, TaN, or TiN, and the source metal 64 may be Ti, or W.

FIGS. 11A-11E illustrate another example of a method for fabricating a semiconductor device with an embedded schottky diode.

Figure 11A:
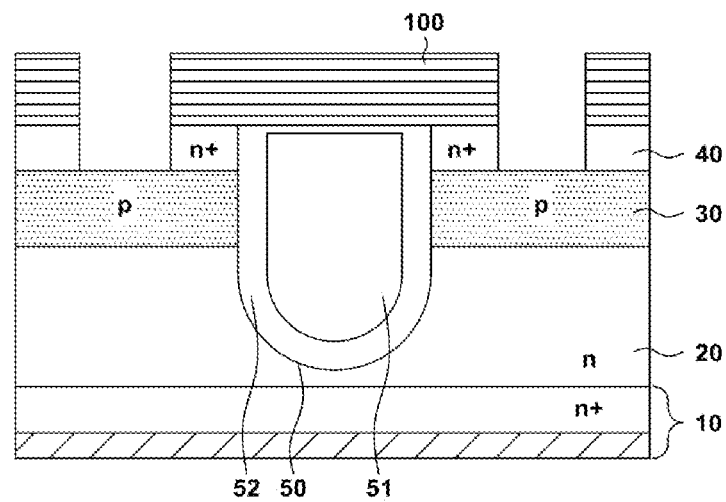
FIG. 11A to 11E illustrate yet another example of a method for manufacturing a semiconductor device with embedded schottky diode.

Since the process illustrated in FIG. 11A is identical to the process illustrated in FIG. 10A, detailed explanation thereof will be omitted for the sake of brevity.

Figure 11B:
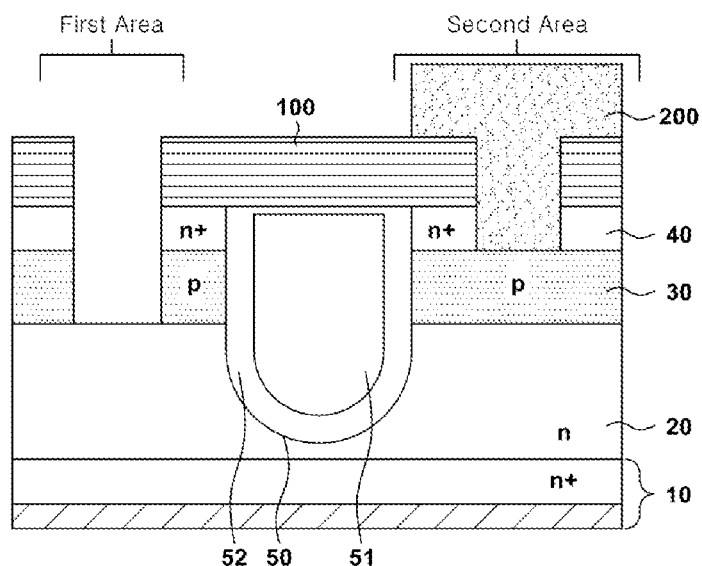

After the process of FIG. 11A, referring to FIG. 11B, a schottky mask 200 is formed, with respect to second area which is a part of the etched area of the etching step. As a result, etching is performed only with respect to the first area where the schottky mask 200 is not formed.

After that, the first area is etched perpendicularly to a third depth. The third depth may be determined appropriately within a range that can ensure that the etching begins from the upper surface of the N+ type source layer 40 and extends through the P type body layer 30. For example, the third depth may be between 0.3 μm and 0.9 μm.

Figure 11C:
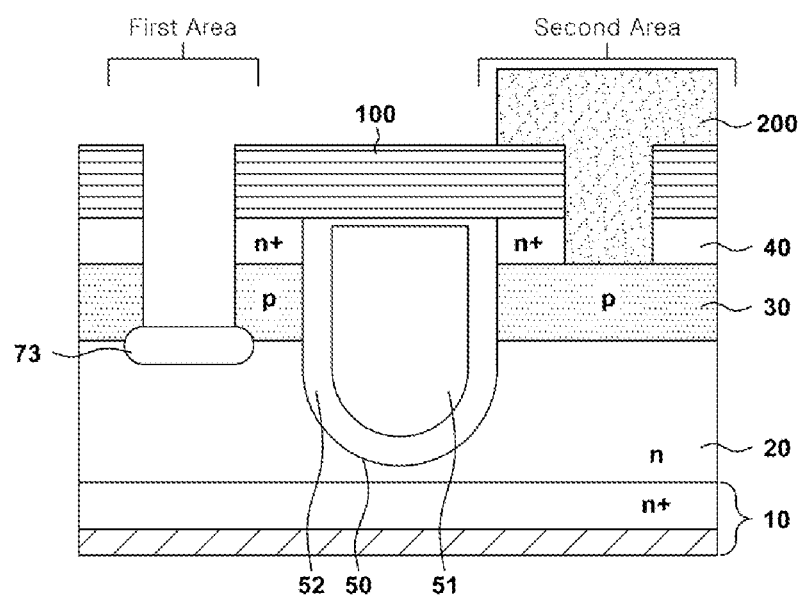

After that, referring to FIG. 11C, P type impurity is ion-implanted into the first area, to thus form P type impurity region 73. In one example of the method, the P type impurity ions may be $BF_2$ ions or $B_{11}$ ions. That is, the P type impurity region 73 may be formed using $BF_2$ or $B_{11}$ as the source of impurity. In one example, the ion implant dose of the P type impurity may range between $1\times10^{12}$ atoms/cm$^2$ and $4\times10^{13}$ atoms/cm$^2$. Further, an RTA process is performed after the P type impurity is implanted, to remove defects resulting from the ion implantation and also to activate the dopant while minimizing diffusion.

Figure 11D:
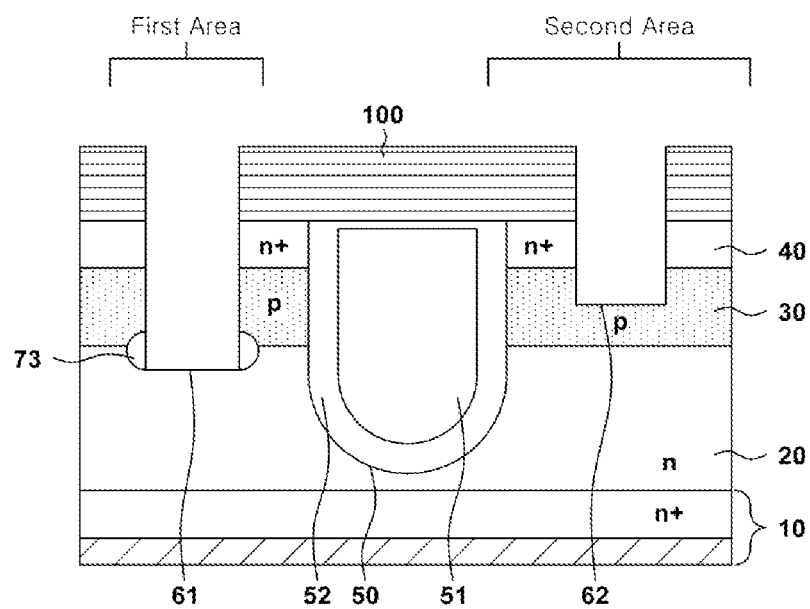

After that, referring to FIG. 11D, the schottky mask 200 is removed from the semiconductor device, and the first and second areas are etched to a fourth depth to thus form the first and second body trenches 61, 62. The fourth depth may be determined within a range that can ensure that the P type impurity region 73 injected into the first area is removed, and the second area is also etched to the fourth depth simultaneously. The fourth depth may range between 0.1 μm and 0.3 μm.

Further, a blanket etching that does not require a separate mask may be applied for the etching to the fifth depth.

Because general etching process has selectivity, if the oxide layer 100 and the semiconductor device have different properties to each other, it is possible to etch the semiconductor device without the oxide layer 100 deposited thereon, without requiring a separate mask.

Figure 11E:
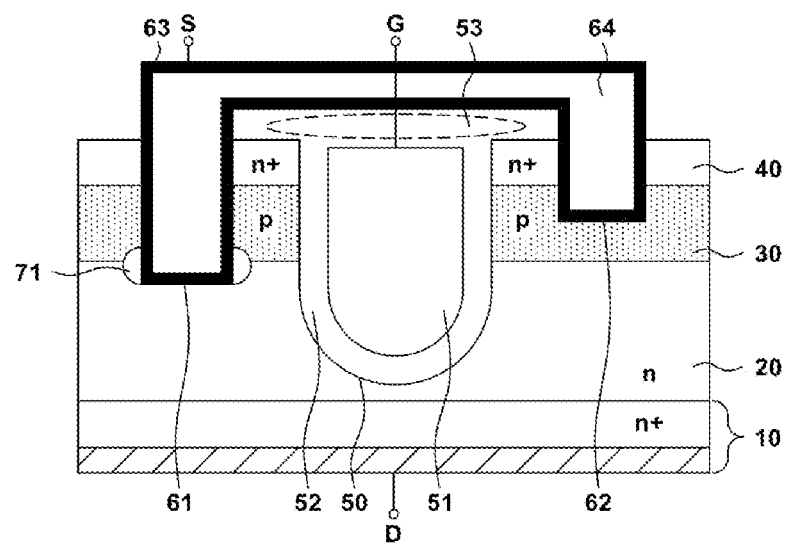

After that, referring to FIG. 11E, the barrier metal 63 may be formed within the first and second body trenches 61, 62, and the source metal 64 may be formed on the barrier metal 63. In one example described above, the barrier metal 63 may be Co, Ta, TaN, Mo, Ti, Pt, W, Ni, or TiN, and the source metal 64 may be Ti, or W.

FIGS. 12A-12E illustrate another example of a method for fabricating a semiconductor device with an embedded schottky diode.

Figure 12A:
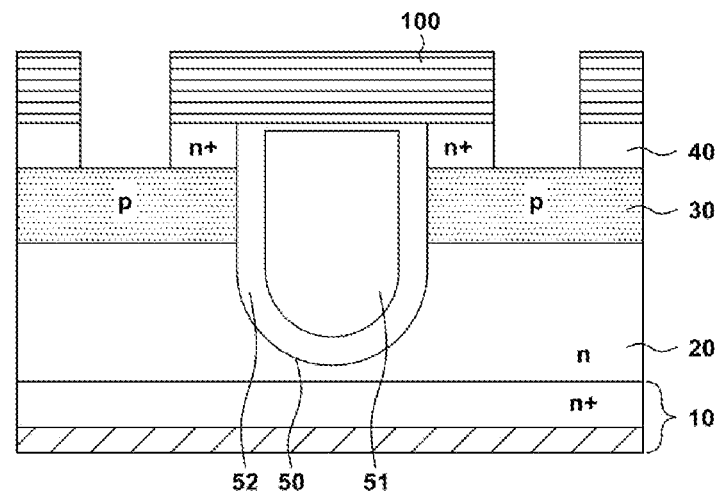
FIG. 12A to 12E illustrate yet another example of a method for manufacturing a semiconductor device with embedded schottky diode.
Figure 12B:
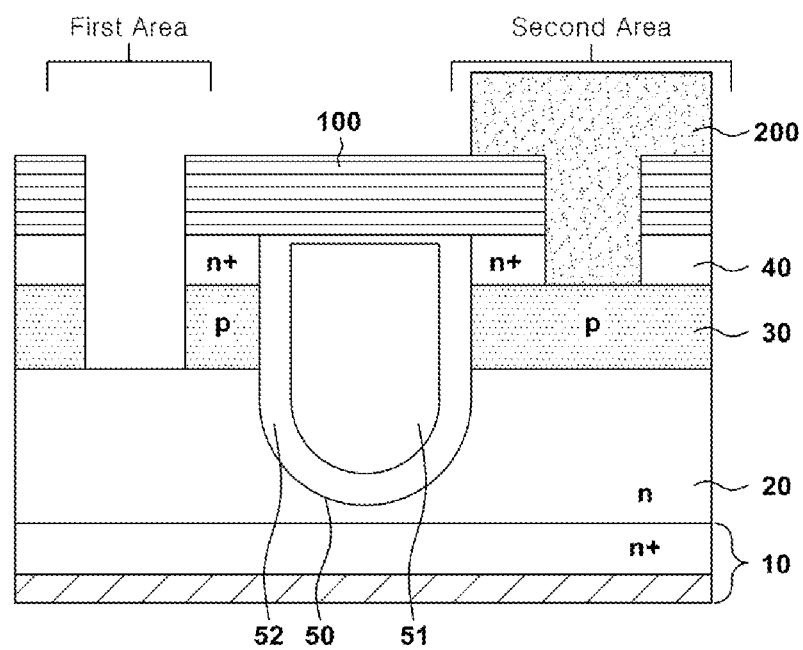

Since the processes illustrated in FIGS. 12A and 12B are identical to the processes illustrated in FIGS. 11A and 11B, detailed explanation thereof will be omitted for the sake of brevity.

Figure 12C:
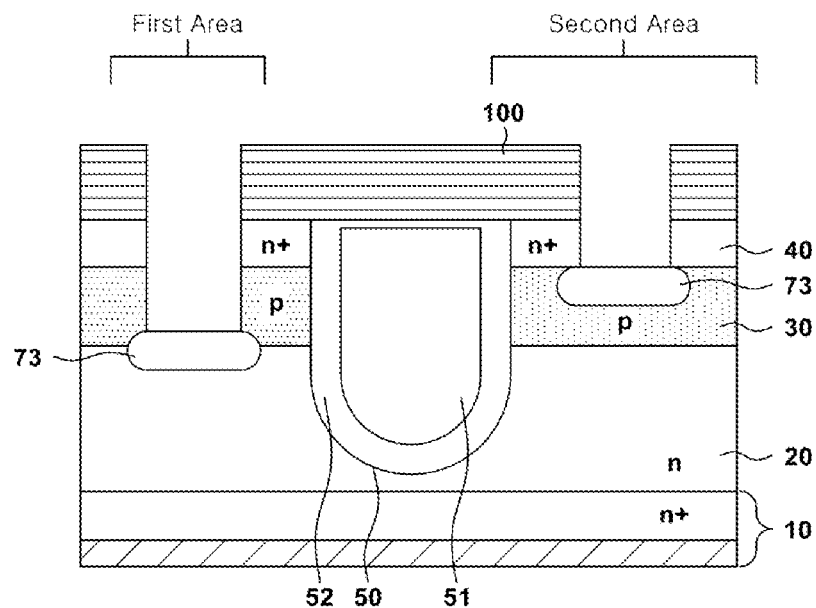

After that, referring to FIG. 12C, the schottky mask 200 is removed and P type impurity is ion-implanted into the first and second areas, to thus form P type impurity region. In one example of the method, the P type impurity ions may be $BF_2$ ions or $B_{11}$ ions. The ion implant dose of the P type impurity may range between $1\times10^{12}$ atoms/$cm^2$ and $4\times10^{13}$ atoms/$cm^2$. Further, an RTA process is performed after the P type impurity is implanted, to remove defects resulting from the ion implantation and also to activate the dopant while minimizing diffusion.

Figure 12D:
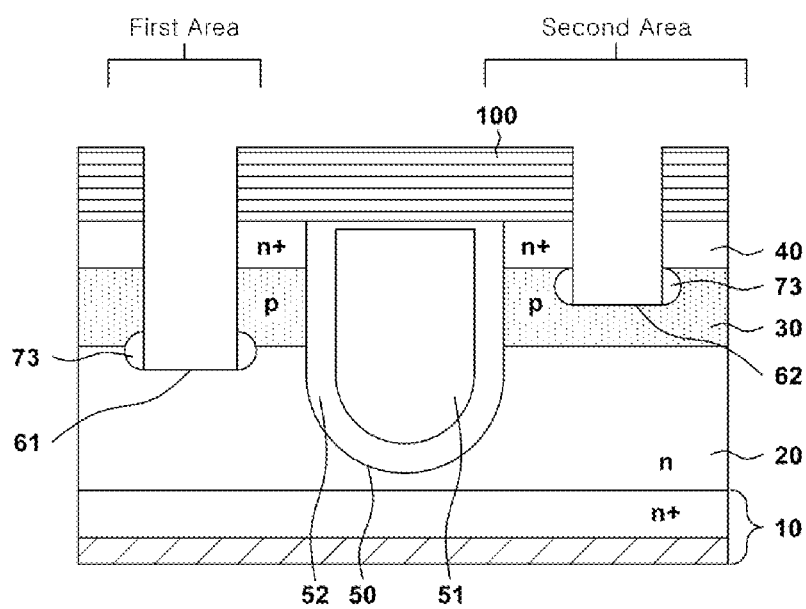

After that, referring to FIG. 12D, the first and second areas are etched to a fourth depth to thus form the first and second body trenches 61, 62. The fourth depth may be determined within a range that can ensure that the P type impurity region 73 injected into the first area is removed, and the second area is also etched to the fourth depth simultaneously. The fourth depth may range between 0.1 μm and 0.2 μm.

Further, a blanket etching process that does not require a separate mask may be applied for the etching to the fifth depth.

Because general etching process has selectivity, if the oxide layer 100 and the semiconductor device have different properties to each other, it is possible to etch the semiconductor device without the oxide layer 100 deposited thereon, without requiring a separate mask for the etching.

Figure 12E:
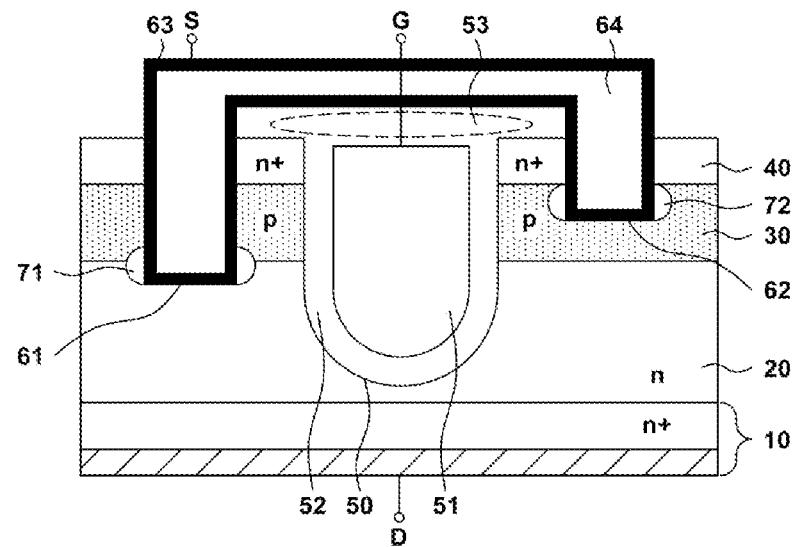

After that, referring to FIG. 12E, the barrier metal 63 may be formed within the first and second body trenches 61, 62. The source metal 64 may be formed on the barrier metal 63. In one example of the method, the barrier metal 63 may be Co, Ta, TaN, Mo, Ti, Pt, W, Ni, or TiN, and the source metal 64 may be Ti, or W.

FIGS. 13A-13F illustrate yet another example of a method for fabricating a semiconductor device with an embedded schottky diode.

Figure 13A:
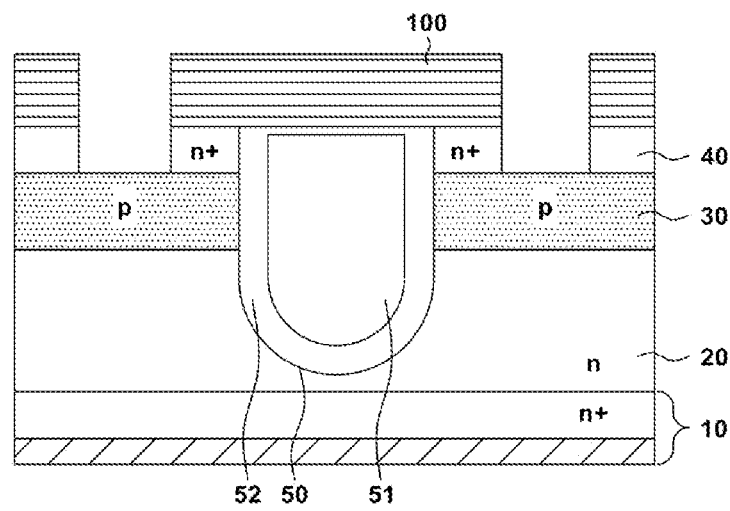
FIG. 13A to 13F illustrate yet another example of a method for manufacturing a semiconductor device with embedded schottky diode.

Since the process illustrated in FIG. 13A is identical to the process illustrated in FIG. 11A, detailed explanation thereof will be omitted for the sake of brevity.

Figure 13B:
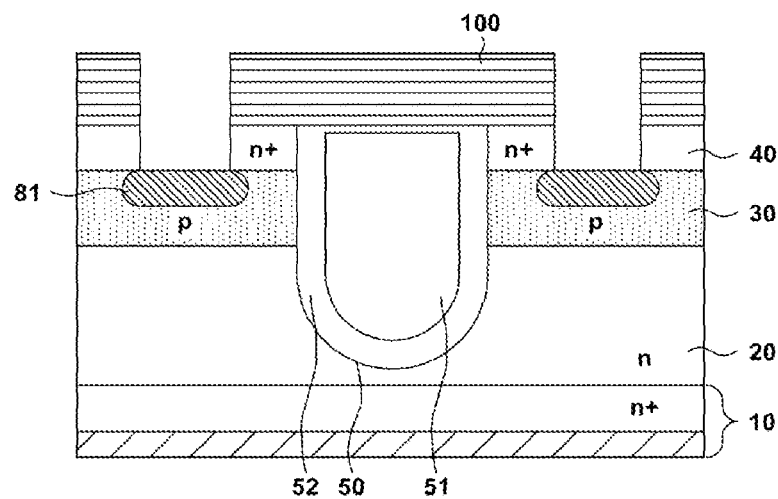

After the process illustrated in FIG. 13A, referring to FIG. 13B, P+ type impurity is ion-implanted into the etched area, to thus form high-concentration P+ type impurity region 81. In one example of the method, the high-concentration P+ type impurity may be obtained using $BF_2$, etc. The ion implant dose of the high-concentration P+ type impurity may range between $5\times10^{14}$ atoms/$cm^2$ and $1\times10^{16}$ atoms/$cm^2$. Further, an RTA process is performed at 900~1050° C. for 10 to 30 sec after the high-concentration P+ type impurity is implanted, to remove defects resulting from the ion implantation and also to activate the dopant while minimizing diffusion.

Figure 13C:
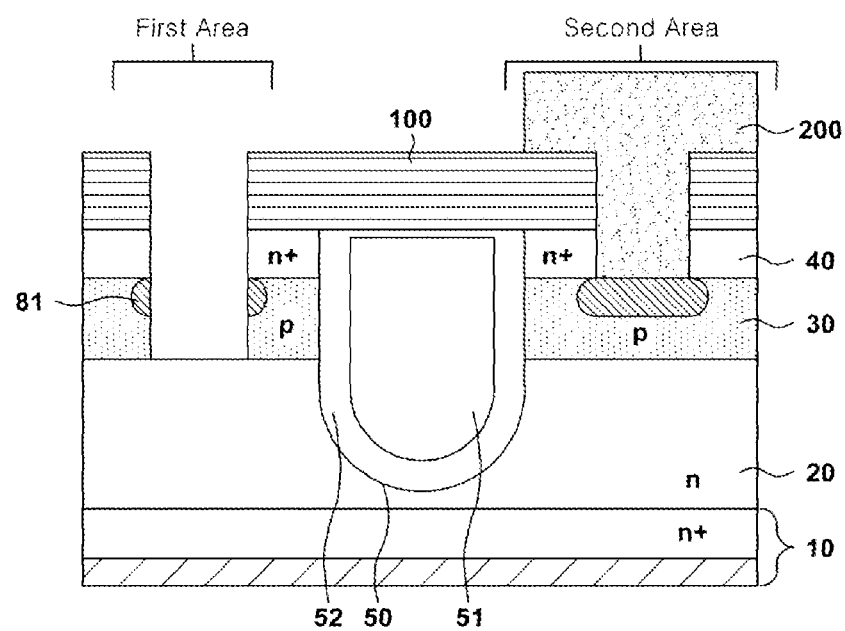

Referring to FIG. 13C, a schottky mask 200 is formed with respect to the second area that is the part of the etched area of the etching step. Accordingly, etching is performed only with respect to the first area where the schottky mask 200 is not formed.

After that, the first area is etched perpendicularly to a third depth. The third depth may be appropriately determined within a range to ensure that the high-concentration P+ type impurity region (body diffusion region; 81) and the P type body layer 30 are removed. For example, the third depth may range between 0.3 μm and 0.9 μm.

Figure 13D:
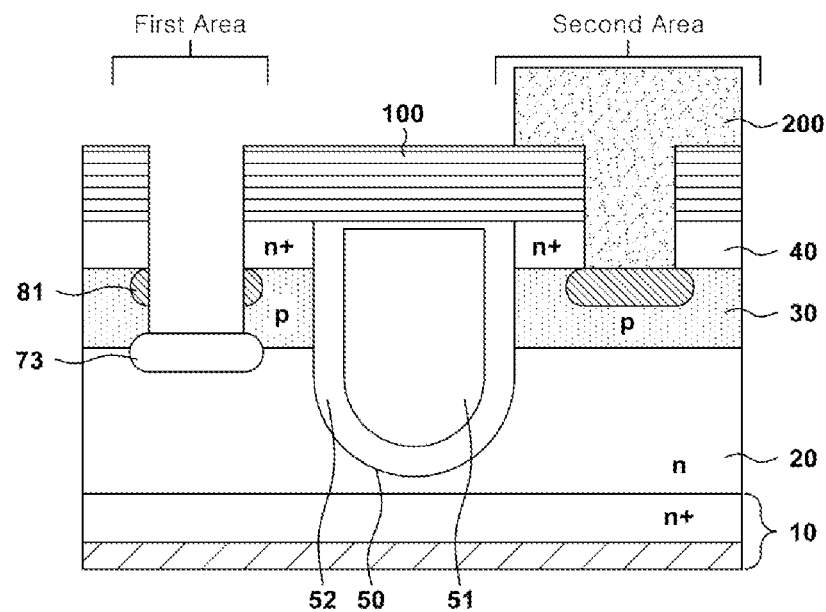
Figure 13E:
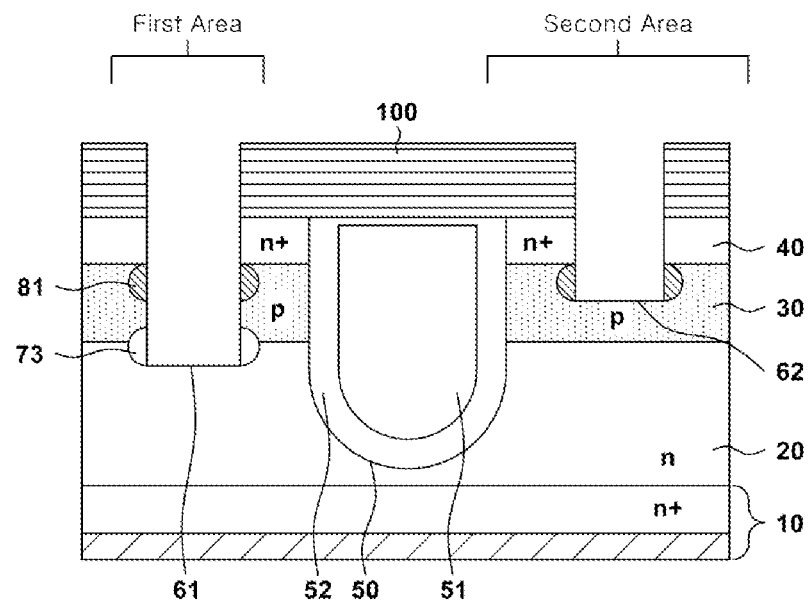

After that, referring to FIG. 13D, P type impurity is ion-implanted into the first area, to ion-implant the P type impurity region 73. In one example of the method, the P type impurity ion source may be $BF_2$, $B_{11}$, etc. The P type impurity region 73 may be formed with a ion implant dose ranging between $1\times10^{12}$ atoms/$cm^2$ and $4\times10^{13}$ atoms/$cm^2$. Further, an RTA process may be performed after the P type impurity is implanted, to remove defects resulting from the ion implantation and also to activate the dopant while minimizing diffusion. After that, referring to FIG. 13E, the schottky mask 200 is removed from the semiconductor device, and the first and second areas are etched to a fourth depth to thus form the first and second body trenches 61, 62. The fourth depth may be determined within a range that can ensure that the P type impurity region 73 injected into the first area is removed. For example, the fourth depth may range between 0.1 μm and 0.3 μm.

Further, a blanket etching process that does not require a separate mask may be applied for the etching to the fifth depth.

Because general etching process has selectivity, if the oxide layer 100 and the semiconductor device have different properties to each other, it is possible to etch the semiconductor device without the oxide layer 100 deposited thereon, without requiring a separate mask.

Figure 13F:
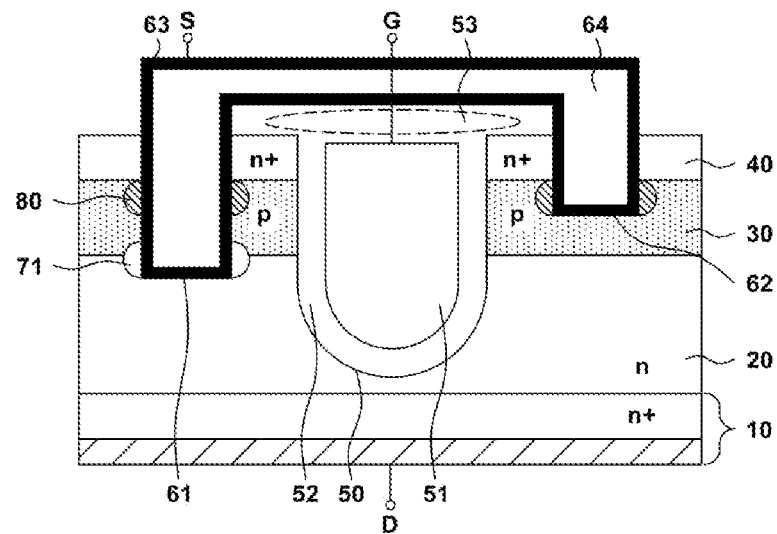

After that, referring to FIG. 13F, the barrier metal 63 may be formed within the first and second body trenches 61, 62 and the source metal 64 may be formed on the barrier metal 63. In example of the method, the barrier metal 63 may be Co, Ta, TaN, Mo, Ti, Pt, W, Ni, or TiN, and the source metal 64 may be Ti, or W.

FIGS. 14A-14F illustrate yet another example of a method for fabricating a semiconductor device with an embedded schottky diode.

Figure 14A:
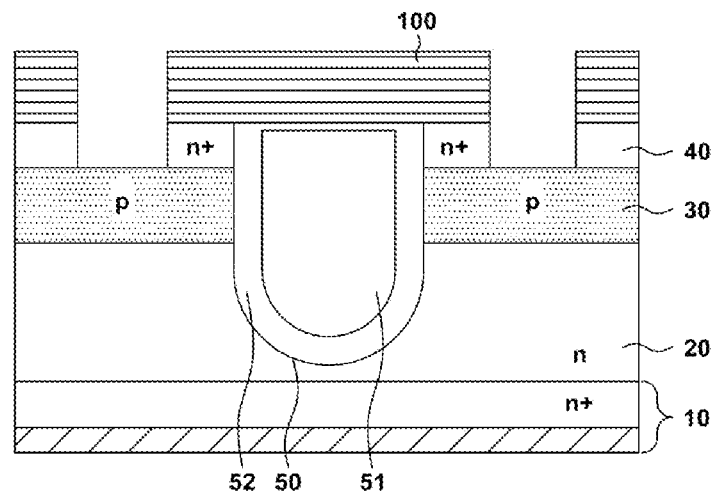
FIG. 14A to 14F illustrate yet another example of a method for manufacturing a semiconductor device with embedded schottky diode.
Figure 14B:
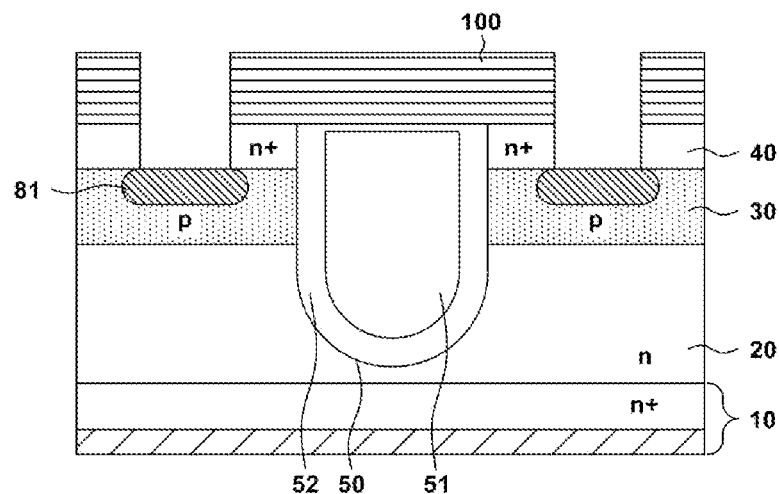
Figure 14C:
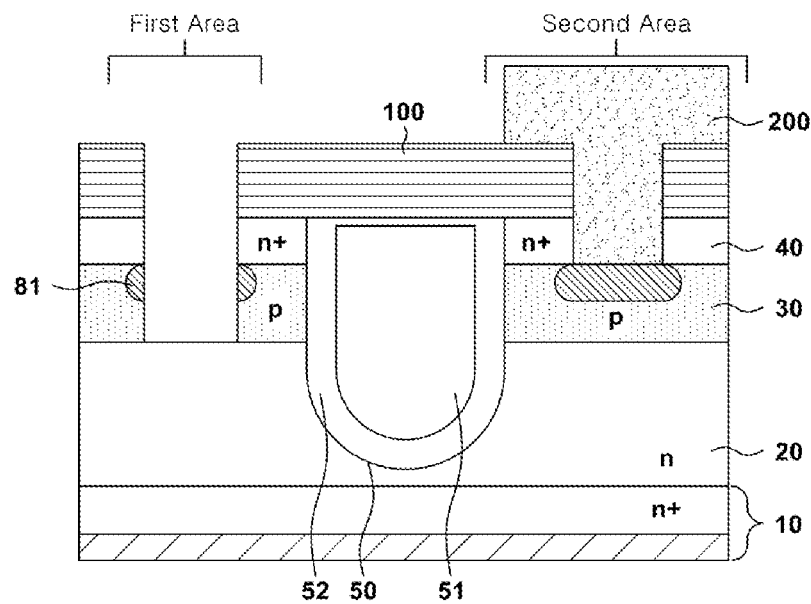

Since the process illustrated in FIGS. 14A to 14C are identical to the process illustrated in FIGS. 13A to 13C, detailed explanation thereof will be omitted for the sake of brevity.

Figure 14D:
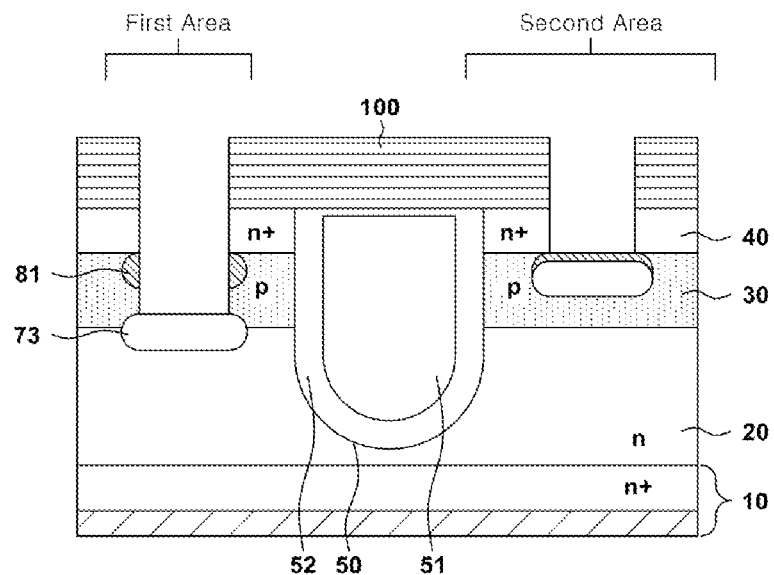
Figure 14E:
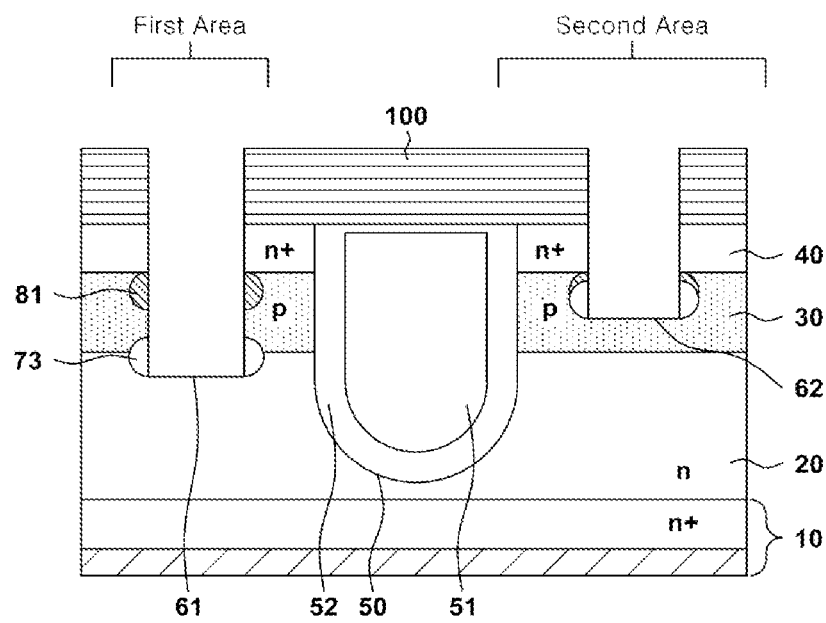

After that the process illustrated in FIGS. 14A to 14C, referring to FIG. 14D, the schottky mask 200 is removed and P type impurity is ion-implanted into the first and second areas, to thus form P type impurity region 73. In one example of the method, the P type impurity ion source may be $BF_2$ or $B_{11}$. For example, the ion implant dose of the P type impurity may range between $1\times10^{12}$ atoms/$cm^2$ and $4\times10^{13}$ atoms/$cm^2$. Further, an RTA process is performed after the P type impurity is implanted, to remove defects resulting from the ion implantation and also to activate the dopant while minimizing diffusion. After that, referring to FIG. 14E, the first and second areas are etched to a fourth depth to thus form the first and second body trenches 61, 62. The fourth depth may be determined within a range that can ensure that the P type impurity region 73 injected into the first area is removed. For example, the fourth depth may range between 0.1 µm and 0.3 µm.

Further, a blanket etching process that does not require a separate mask, may be applied for the etching to the fifth depth.

Because general etching process has selectivity, if the oxide layer 100 and the semiconductor device have different properties to each other, it is possible to etch the semiconductor device without the oxide layer 100 deposited thereon, without requiring a separate mask.

Further, the high-concentration P+ type impurity region 81 (body diffusion region) and the P type impurity region 73 (guard ring) may be merged with each other on the outer wall of the second body trench 62.

Figure 14F:
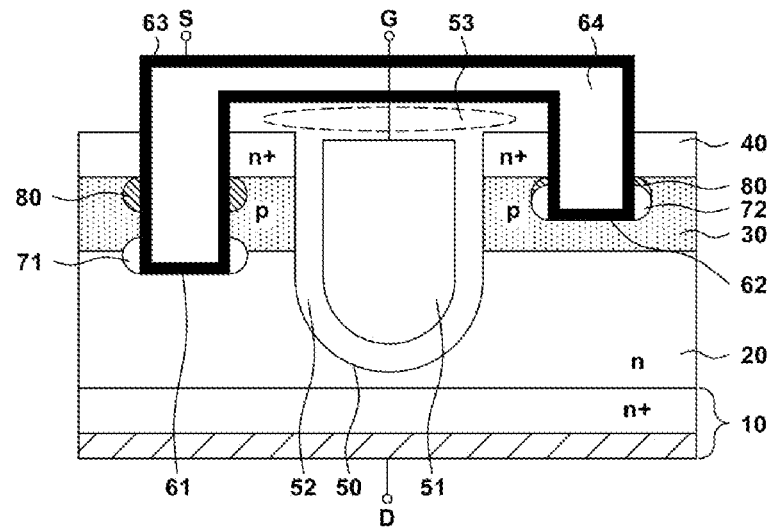

After that, referring to FIG. 14F, the barrier metal 63 may be formed within the first and second body trenches 61, 62, and the source metal 64 may be formed on the barrier metal 63. In one example of the method, the barrier metal 63 may be Co, Ta, TaN, Mo, Ti, Pt, W, Ni, or TiN, and the source metal 64 may be Ti, or W.

FIGS. 15A-15D illustrate yet another example of a method for fabricating a semiconductor device with an embedded schottky diode.

Figure 15A:
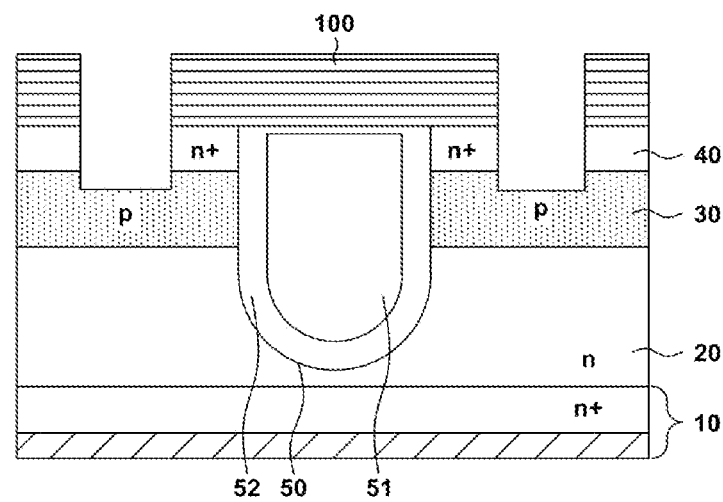
FIG. 15A to 15D illustrate yet another example of a method for manufacturing a semiconductor device with embedded schottky diode.

First, referring to FIG. 15A, the N type epilayer 20, the P type body layer 30 and the high-concentration N+ type source layer 40 are stacked on the high-concentration N+ type substrate 10 in turn. On the semiconductor device in which the gate trench 50 perpendicularly extends from the N+ type source layer 40 to a part of the N type epilayer 20 to the first depth, etching is performed to a second depth to form a trench structure which is at a predetermined distance from the gate trench 50 and which perpendicularly extends from the N+ type source layer 40. For instance, the N type epilayer 20, the P type body layer 30 and the high-concentration N+ type source layer 40 are stacked on the high-concentration N+ type substrate 10 in turn. An oxide layer 100 is deposited on the semiconductor device with the gate trench 50 extending from the N+ type source layer 40 to a part of the N type epilayer 20. An etching mask is formed with an opening at the areas that are to be etched, on the oxide layer 100 to thus etch the exposed areas of the etching mask. Separately from the etching on the oxide layer 100, the semiconductor device may be etched to the second depth, according to an example of the method.

In one example method, the second depth may range between 0.3 µm and 0.4 µm. Further, the second depth is so determined to ensure that the etched portion begins from the surface of the N+ type source layer 40 of the semiconductor device and extends through the N+ type source layer 40. The second depth may be so determined to reach the underneath area of part of the N+ type source layer. Further, the second depth may be so determined that the etched portion is extended through the N+ type source layer 40 of the semiconductor device and defines a predetermined reserve area underneath the N+ type source layer 40.

Figure 15B:
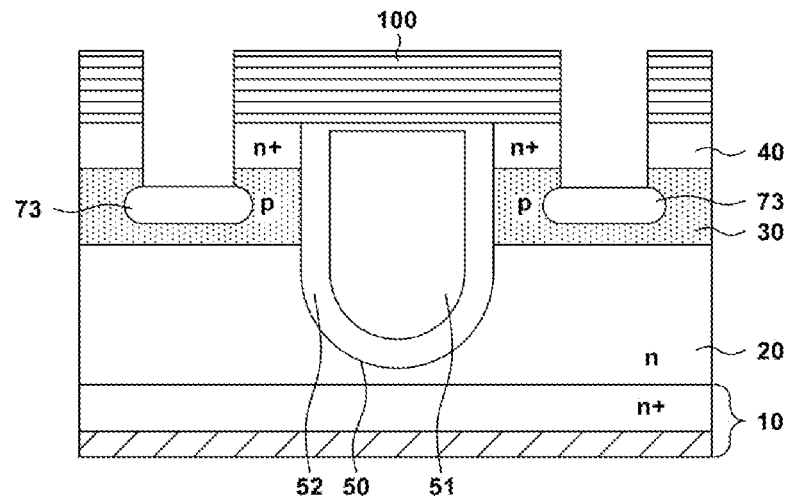
Figure 15C:
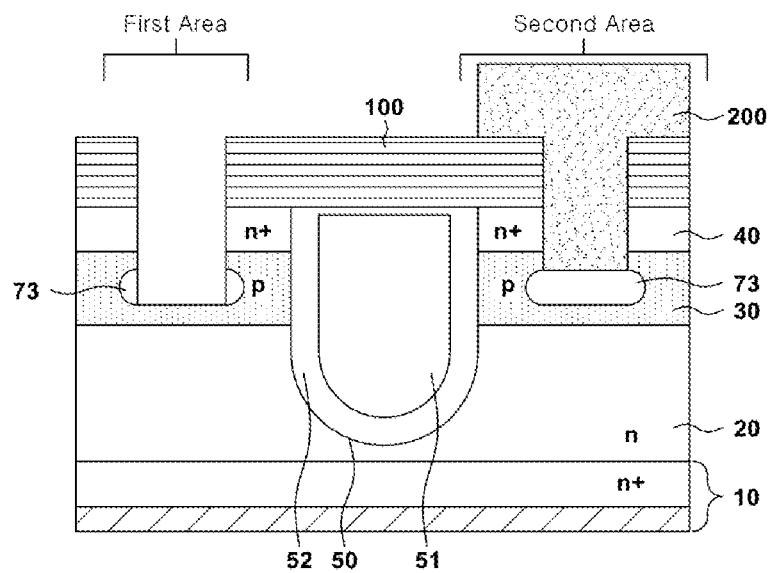

After that, referring to FIG. 15B, P type impurity is ion-implanted into the etched portion of the etching step, to thus form P type impurity region 73. In one example of the method, the P type impurity ion source may be $BF_2$ or $B_{11}$. The ion implant dose for forming the P type impurity may range between $1 \times 10^{13}$ atoms/cm$^2$ and $1 \times 10^{14}$ atoms/cm$^2$. The P type impurity may be at a greater ion implant dose than in the embodiments illustrated in FIGS. 9 to 13. Further, an RTA process is performed after the P type impurity is implanted, to remove defects resulting from the ion implantation and also to activate the dopant while minimizing diffusion. After that, referring to FIG. 15C, the schottky mask 200 is formed with respect to the second area which is the part of the etched area. As a result, etching is performed only with respect to the first area where the schottky mask 200 is not formed.

After that, the first area is perpendicularly etched to a third depth. The third depth is so determined to ensure that the etched portion is extended through the P type impurity region 73 injected into the first area. For example, the third depth may range between 0.1 µm and 0.2 µm.

When the first body trench 61 formed as explained above, the lower surface of the first body trench 61 may be at a near distance to the upper surface of the N type epilayer 20, enabling operation similar to that of a schottky diode, with the P type impurity region 73.

Figure 15D:
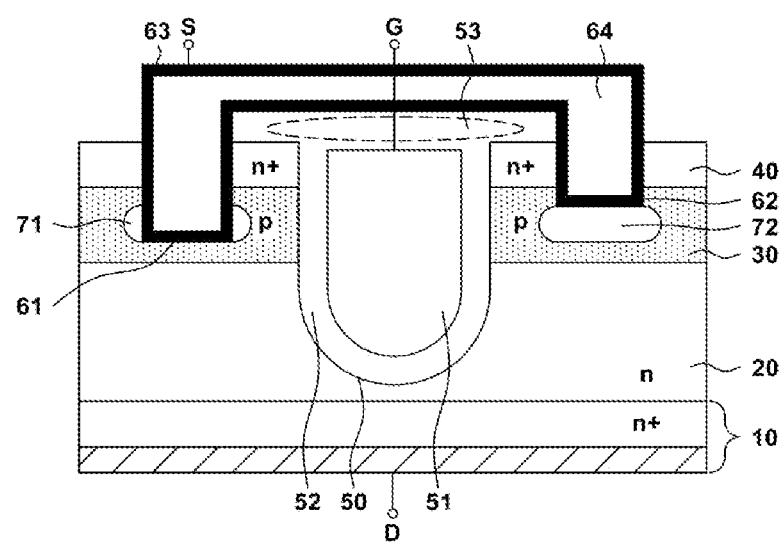

After that, referring to FIG. 15D, the barrier metal 63 may be formed within the first and second body trenches 61, 62, and the source metal 64 may be formed on the barrier metal 63. In one example, the barrier metal 63 may be Co, Ta, TaN, Mo, Ti, Pt, W, Ni, or TiN, and the source metal 64 may be Ti, or W.

According to the method explained above, it is possible to fabricate a semiconductor device with an embedded schottky diode requiring a less masking process than in the conventional art. Since the number of masking processes is reduced, the manufacture cost for the overall fabricating process can be reduced.

Described above are examples of semiconductor devices and methods of fabricating the same. According to some of the examples, the schottky diode structure is embedded in the active region of a switching MOSFET, without requiring a separate, additional space.

Further described are examples of semiconductor devices with an embedded schottky diode having a guard ring at an outer area of the schottky diode, and a manufacturing method thereof.

Further described above are examples of semiconductor devices with an embedded schottky diode, in which a guard ring is provided on the outer region of the schottky diode, to thus minimize current loss, and a manufacturing method thereof.

Further described above are examples of semiconductor devices with an embedded schottky diode that includes a first conductivity type epilayer formed on an upper portion of a substrate; a second conductivity type body layer stacked on an upper portion of the epilayer; a first conductivity type source layer stacked on an upper portion of the body layer; a gate trench perpendicularly extending from the source layer to a part of the epilayer; a body trench formed a predetermined distance to the left and right of the gate trench, and perpendicularly extending from the source layer to a part of the epilayer; and a second conductivity type guard ring contacting an outer wall of the body trench and formed in the epilayer.

The semiconductor device may additionally include a second conductivity type body diffusion region formed in an area of the body layer to contact an outer wall of the body trench.

Also described above are examples of semiconductor devices with an embedded schottky diode that may include: a first conductivity type epilayer formed on an upper portion of a substrate; a second conductivity type body layer stacked on an upper portion of the epilayer; a first conductivity type source layer stacked on an upper portion of the body layer; a gate trench perpendicularly extending from the source layer to a part of the epilayer; a first body trench and a second body trench formed a predetermined distance to the left and right of the gate trench, and perpendicularly extending from the source layer to different depths from each other; and a second conductivity type of first guard ring which contacts an outer wall of the first body trench and which is formed in the epilayer.

The semiconductor device may additionally include a second conductivity type of second guard ring which contacts an outer wall of the second body trench and which is formed in the body layer.

Further, the semiconductor device may additionally include a second conductivity type body diffusion region formed in an area of the body layer to contact an outer wall of the first and second body trenches.

Also described above are examples of semiconductor devices with an embedded schottky diode that may include a first conductivity type epilayer formed on an upper portion of a substrate; a second conductivity type body layer stacked on an upper portion of the epilayer; a first conductivity type source layer stacked on an upper portion of the body layer; a gate trench perpendicularly extending from the source layer to a part of the epilayer; a first body trench and a second body trench formed a predetermined distance to the left and right of the gate trench, and perpendicularly extending from the source layer to a part of the body layer; and a second conductivity type of first guard ring formed in the body layer to contact an outer wall of the first body trench.

The first and second body trenches may be extended to a same depth.

The semiconductor device may additionally include a second conductivity type of second guard ring formed in the body layer to contact an outer wall of the second body trench.

The first and second body trenches may be extended to different depths.

The semiconductor device may additionally include a second conductivity type of second guard ring formed in the body layer to contact a lower wall of the second body trench.

Also described above are examples of methods for fabricating a schottky diode embedded in a semiconductor device comprising a first conductivity type of epilayer, a second conductivity type of body layer and a high-concentration first conductivity type of source layer stacked on a substrate in turn, and a gate trench extending perpendicularly from the source layer to a part of the epilayer to a first depth, is provided, which may include (A) etching at a predetermined distance from the gate trench, and perpendicularly from the source layer to a part of the epilayer to a second depth; (B) ion-implanting a second conductivity type of impurity into an interior etched at step (A); and (C) forming a body trench by etching through the second conductivity type of impurity to a third depth.

The step (A) may include (A-1) perpendicularly etching from the surface of the source layer to a fourth depth; (A-2) ion-implanting a second conductivity type of impurity into an interior which is etched at step (A-1); and (A-3) etching through the impurity injected at step (A-2) to a part of the epilayer to a fifth depth.

Also described above are examples of methods for fabricating a schottky diode embedded in a semiconductor device comprising a first conductivity type of epilayer, a second conductivity type of body layer and a first conductivity type of source layer stacked on a substrate in turn, and a gate trench extending perpendicularly from the source layer to a part of the epilayer, is provided, which may include (A) etching at a predetermined distance to the left and right of the gate trench, and perpendicularly from the source layer to a second depth; (B) forming a schottky mask with respect to a second area which is a part of the area etched at step (A); (C) perpendicularly etching the first area where the schottky mask is not formed to a third depth; (D) ion-implanting a second conductivity type of impurity into an interior etched at step (C); and (E) forming a body trench by etching the first and second areas to a fourth depth.

Prior to step (E), the method may additionally include a step (D2) of ion-implanting a second conductivity type of impurity into the second area which is etched.

Prior to step (B), the method may additionally include a step (A2) of ion-implanting a second conductivity type of impurity into an interior which is etched at step (A).

Prior to step (E), the method may additionally include a step (D2) of ion-implanting a second conductivity type of impurity into the second area which is etched.

Also described above are examples of methods for fabricating a schottky diode embedded in a semiconductor device comprising a first conductivity type of epilayer, a second conductivity type of body layer and a first conductivity type of source layer stacked on a substrate in turn, and a gate trench extending perpendicularly from the source layer to a part of the epilayer, is provided, which may include (A) etching at a predetermined distance to the left and right of the gate trench, and perpendicularly from the source layer to a second depth; (B) ion-implanting a second conductivity type of impurity into an interior etched at step (A); (C) forming a schottky mask with respect to a second area which is a part of the area etched at step (A); and (D) etching the first area where the schottky mask is not formed, to a third depth through the second conductivity type of impurity.

According to one example, a semiconductor device with an embedded schottky diode and a manufacturing method thereof provide advantages such as reduced device price and also reduced parasitic inductance, because schottky diode is formed in the body diffusion region, without requiring a separate space.

Further, according to one example, a semiconductor device with an embedded schottky diode and a manufacturing method provide the advantage of large current control, since a guard ring is provided at a body layer region, which is an outer area of the schottky diode, to thereby implement fast switching characteristic and reduce current loss.

It is understood that the features of the present disclosure may be embodied in different forms and should not be constructed as limited to the examples set forth herein. Rather, examples are provided so that this disclosure will be thorough and complete, and will convey the full scope of the present disclosure to those skilled in the art. The drawings may not be necessarily to scale, and, in some instances, proportions may have been exaggerated in order to clearly illustrate features of the examples. When a first layer is referred to as being "on" a second layer or "on" a substrate, it may not only refer to a case where the first layer is formed directly on the second layer or the substrate but may also refer to a case where a third layer exists between the first layer and the second layer or the substrate.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A semiconductor device having a schottky diode, the semiconductor device comprising:
an epitaxial layer of a first conductivity type, a body layer of a second conductivity type, and a source layer of the first conductivity type arranged in that order;
a gate trench extending from the source layer to a part of the epitaxial layer;
a body trench formed at a predetermined distance from the gate trench and extending from the source layer to a part of the epitaxial layer;
a barrier metal formed along an inner wall of the body trench;
a source metal formed on the barrier metal; and
a guard ring of the second conductivity type contacting the barrier metal and formed in the epitaxial layer, and
wherein a bottom surface of the body trench is in direct contact with the epitaxial layer, such that the bottom surface of the body trench forms a schottky contact with the epitaxial layer, and a portion of the guard ring is formed below a junction between the body layer and the epitaxial layer.

2. The semiconductor device of claim 1, wherein the gate trench comprises:
a gate polysilicon formed within the gate trench; and
a gate insulating layer that surrounds the gate polysilicon.

3. The semiconductor device of claim 1, wherein the guard ring protrudes into both the epitaxial layer and the body layer.

4. The semiconductor device of claim 1, wherein the guard ring has a doping ion implant dose equal to that of the body layer.

5. The semiconductor device of claim 1, further comprising a second conductivity type body diffusion region formed in the body layer and contacts an outer wall of the body trench.

6. The semiconductor device of claim 5, wherein the body diffusion region contacts a lower surface of the source layer.

7. The semiconductor device of claim 1, wherein the barrier metal is selected from a group consisting of Co, Ta, Mo, Ti, Pt, W, Ni and TiN.

8. The semiconductor device of claim 1, wherein a bottom of the barrier metal forms a schottky contact with the epitaxial layer.

9. The semiconductor device of claim 1, wherein the guard ring contacts a side wall of the barrier metal.

10. A semiconductor device with a schottky diode, the semiconductor device comprising:
a semiconductor substrate having a top surface;
an epitaxial layer of a first conductivity type, a body layer of a second conductivity type, a source layer of the first conductivity type arranged in that order on the semiconductor substrate;
a gate trench extending from the source layer to a part of the epitaxial layer;
a first body trench and a second body trench formed at a predetermined distance from the gate trench and extending into the semiconductor device with respect to the top surface of the substrate, the first body trench and the second body trench having different depths with respect to the top surface of the substrate; and
a first guard ring of the second conductivity type contacting an outer wall of the first body trench and formed in the epitaxial layer, and
wherein a bottom surface of the first body trench is in direct contact with the epitaxial layer, such that the bottom surface of the first body trench forms a schottky contact with the epitaxial layer, and a portion of the guard ring is formed below a junction between the body layer and the epitaxial layer.

11. The semiconductor device of claim 10, wherein the gate trench comprises:
a gate polysilicon formed within the gate trench; and
a gate insulating layer that surrounds the gate polysilicon.

12. The semiconductor device of claim 10, wherein the first body trench extends from the source layer to a part of the epitaxial layer in a direction perpendicular to an upper surface of the source layer, and
the second body trench extends from the source layer to a part of the body layer in a direction perpendicular to the upper surface of the source layer.

13. The semiconductor device of claim 10, wherein the first guard ring protrudes into both the epitaxial layer and the body layer.

14. The semiconductor device of claim 10, further comprising a second guard ring of the second conductivity type that contacts an outer wall of the second body trench and formed in the body layer.

15. The semiconductor device of claim 14, wherein the first and second guard rings have doping concentrations that are equal to a doping concentration of the body layer.

16. The semiconductor device of claim 10, further comprising a body diffusion region of the second conductivity type formed in the body layer to contact an outer wall of the first and second body trenches.

17. The semiconductor device of claim 16, wherein the body diffusion region contacts a lower surface of the source layer.

18. The semiconductor device of claim 16, further comprising a second guard ring of the second conductivity type formed in the body layer and contacts an outer wall of the second body trench.

19. The semiconductor device of claim 18, wherein the first and second guard rings have doping concentrations that are equal to a doping concentration of the body layer.

20. The semiconductor device of claim 18, wherein the body diffusion region and the second guard ring are merged with each other.

21. The semiconductor device of claim 10, further comprising a barrier metal located along an inner wall of the first body trench.

22. The semiconductor device of claim 21, wherein a bottom of the barrier metal forms a schottky contact.

23. The semiconductor device of claim 21, wherein the second guard ring contacts a side wall of the barrier metal.

24. A semiconductor device having a schottky diode, the semiconductor device comprising:
a substrate having a top surface;
a semiconductor layer of a first conductivity type, a body layer of a second conductivity type formed in the substrate;
a gate trench extending from the top surface to a part of the semiconductor layer;
a body trench formed at a predetermined distance from the gate trench and extending from the top surface to a part of the semiconductor layer; and
a guard ring of the second conductivity type contacting a side wall of the body trench and formed in the semiconductor layer, and
wherein a bottom surface of the body trench is in direct contact with the semiconductor layer, such that the bottom surface of the body trench forms a schottky contact with the semiconductor layer, and wherein a portion of the guard ring formed below a junction created between the body layer and the semiconductor layer.

25. The semiconductor device of claim 24, further comprising a barrier metal located along an inner wall of the body trench.

26. The semiconductor device of claim 25, wherein the guard ring contacts a side wall of the barrier metal.

27. The semiconductor device of claim 24, further comprising a second conductivity type body diffusion region formed in the body layer and contacts the side wall of the body trench.

28. The semiconductor device of claim 27, wherein the body diffusion region has a higher doping concentration than that of the guard ring.

29. The semiconductor device of claim 24, wherein the body trench comprises a first body trench and a second body trench formed a predetermined distance from the gate trench, and wherein at least one of the first body trench and the second body trench comprises a non-schottky contact.

30. The semiconductor device of claim 24, wherein the body trench is extended through the guard ring.

\* \* \* \* \*